(12) United States Patent
Arif et al.

(10) Patent No.: US 8,600,710 B2
(45) Date of Patent: Dec. 3, 2013

(54) METHOD OF MODELING THERMAL PROBLEMS USING A NON-DIMENSIONAL FINITE ELEMENT METHOD

(75) Inventors: Abdul Fazal Muhammad Arif, Dhahran (SA); Sulaman Pashah, Dhahran (SA); Syed M. Zubair, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 261 days.

(21) Appl. No.: 13/253,778

(22) Filed: Oct. 5, 2011

(65) Prior Publication Data
US 2013/0090899 A1    Apr. 11, 2013

(51) Int. Cl.
G06F 7/60    (2006.01)
(52) U.S. Cl.
USPC .................................. 703/2; 703/5; 703/22
(58) Field of Classification Search
None
See application file for complete search history.

(56) References Cited

U.S. PATENT DOCUMENTS

| | | | |
|---|---|---|---|
| 5,437,190 A * | 8/1995 | Ehrenpreis et al. | 73/802 |
| 7,647,216 B2 | 1/2010 | Bermejo Alvarez et al. | |
| 2004/0194051 A1 * | 9/2004 | Croft | 716/20 |
| 2008/0099569 A1 | 5/2008 | Plumpton et al. | |
| 2009/0259447 A1 | 10/2009 | Langemyr et al. | |
| 2010/0174515 A1 | 7/2010 | Madhavan et al. | |
| 2010/0204963 A1 * | 8/2010 | Shapiro | 703/1 |
| 2010/0280800 A1 | 11/2010 | Yilbas et al. | |

OTHER PUBLICATIONS

Krysl et al. ("Dimensional model reduction in non-linear finite element dynamics of solids and structures", International Journal for Numerical Methods in Engineering, 2001, pp. 479-504).*
Kim et al. ("Quadrature Error of the Load Vector in the Finite Element Method", Korean J. Comput. & Appl. Math. vol. 5 (1998), No. 3, pp. 645-657).*
Klaus-Jfirgen Bathe and Mohammad R. Khoshgoftaar, "Finite Element Formulation and Solution of Nonlinear Heat Transfer", *Nuclear Engineering and Design*, 51 (1979) 389-401.
Jia Tzer Hsu and Loc Vu-Quos, "A Rational Formulation of Thermal Circuit Models for Electrothermal Simulation-Part I: Finite Element Method", *IEEE Transactions on Circuits and Systems-I Fundamental Theory and Applications*, vol. 43, No. 9, Sep. 1996.

(Continued)

*Primary Examiner* — Omar Fernandez Rivas
*Assistant Examiner* — Iftekhar Khan
(74) *Attorney, Agent, or Firm* — Richard C. Litman

(57) ABSTRACT

The method of modeling thermal problems using a non-dimensional finite element method is a computerized method for modeling thermal systems that relies on the variational principle. The variational principle specifies the total potential of the system, given by a scalar quantity $\Pi$, which is defined by an integral form for a continuum problem. The solution of the continuum problem is a function that makes $\Pi$ stationary with respect to the state variables. The governing equation of the problem is used to calculate the potential $\Pi$. The non-dimensional form of the potential is obtained by insertion of the defined non-dimensionless parameters. The element non-dimensional stiffness matrix and the non-dimensional load vectors are then obtained by invoking the stationarity of the non-dimensional potential $\overline{\Pi}$ with respect to a non-dimensional temperature vector $\{\theta\}$.

5 Claims, 13 Drawing Sheets

(56) References Cited

OTHER PUBLICATIONS

M. R. Frewin and D. A. Scott, "Finite Element Model of Pulsed Laser M. A. Zocher and S. E. Groves, "A Three-Dimensional Finite Element Formulation for Thermoviscoelastic Orthotropic Media", *International Journal for Numerical Methods in Engineering*, vol. 40, 2267-2288 (1997). Welding", *Welding Journal* New York, 1999, vol. 78; No. 1, pp. 15-22.

Jeong-Ha Kim and G H. Paulino, "Isoparametric Graded Finite Elements for Nonhomegeneous Isotropic and Orthotropic Materials", *Transactions of the ASME*, vol. 69, pp. 502-514, Jul. 2002.

S. Pashah, A.F.M. Arif, and Syed M. Zubair, "Study of orthotropic pin fin performance through axisymmetric thermal non-dimensional finite element", *Applied Thermal Engineering*, vol. 31, Issues 2-3, Feb. 2011, pp. 376-384.

\* cited by examiner

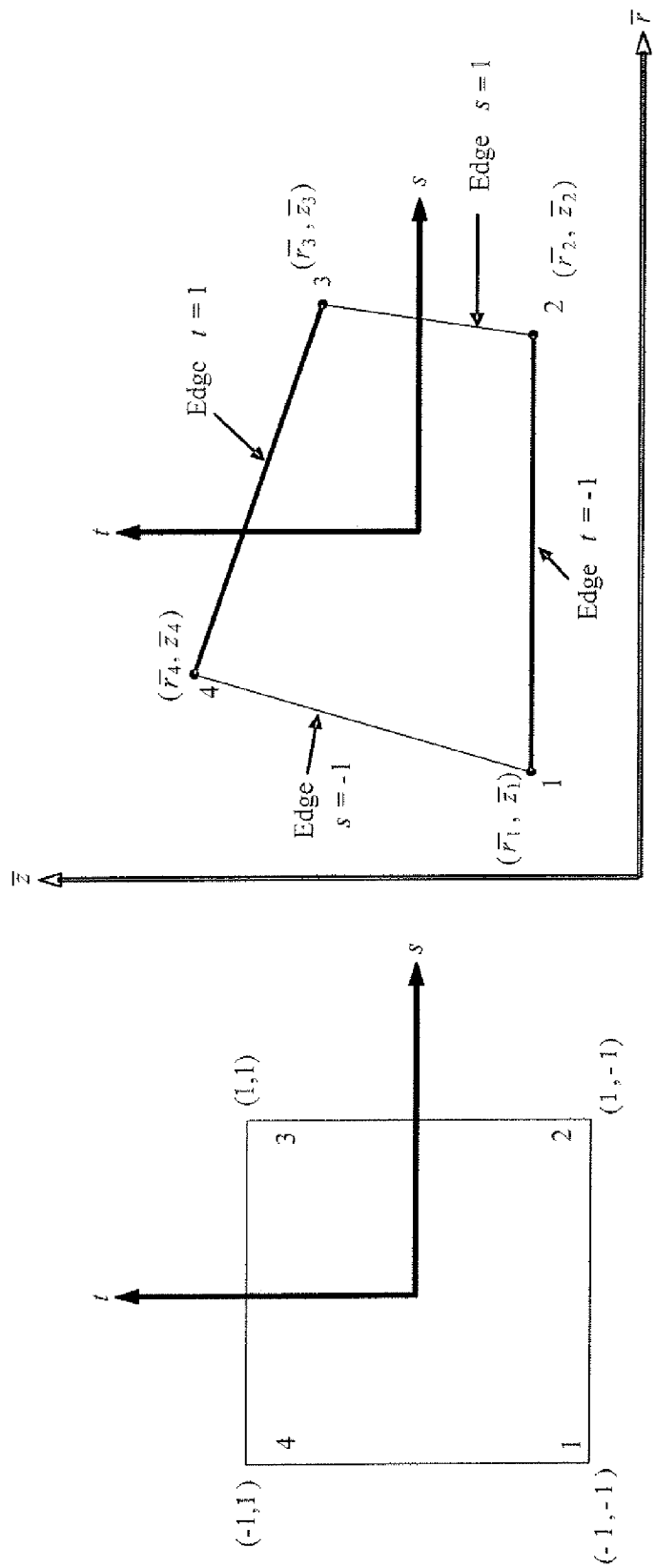

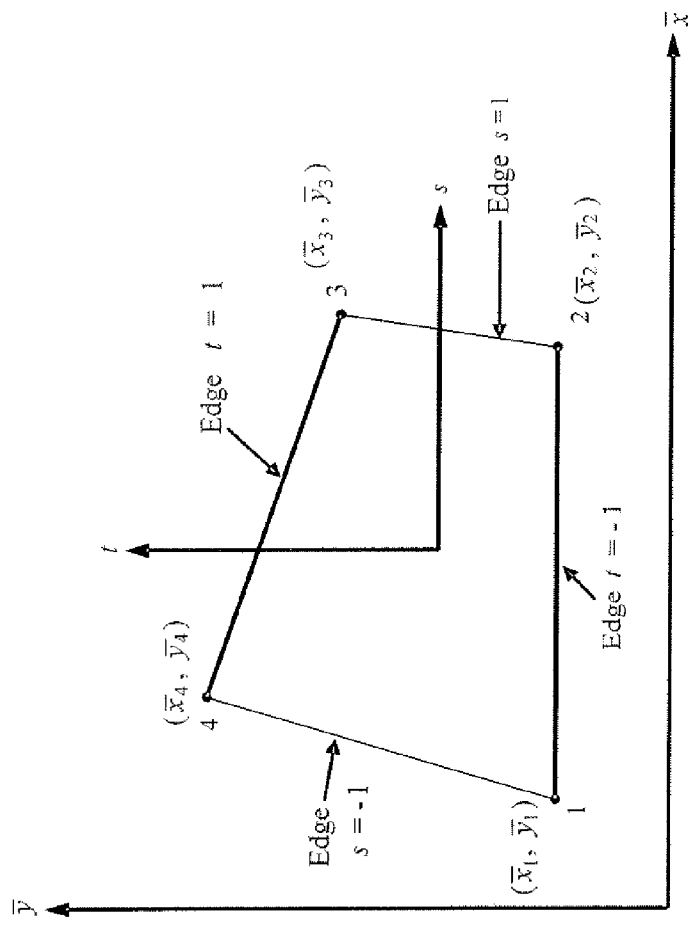
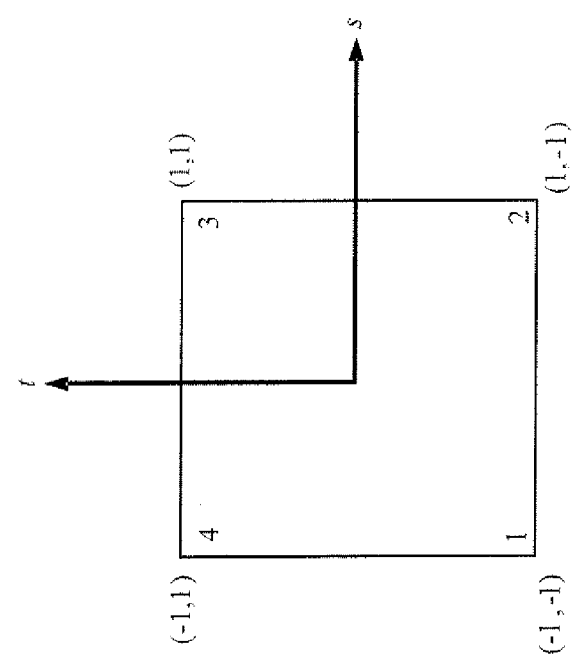
Fig. 3B
Fig. 3A

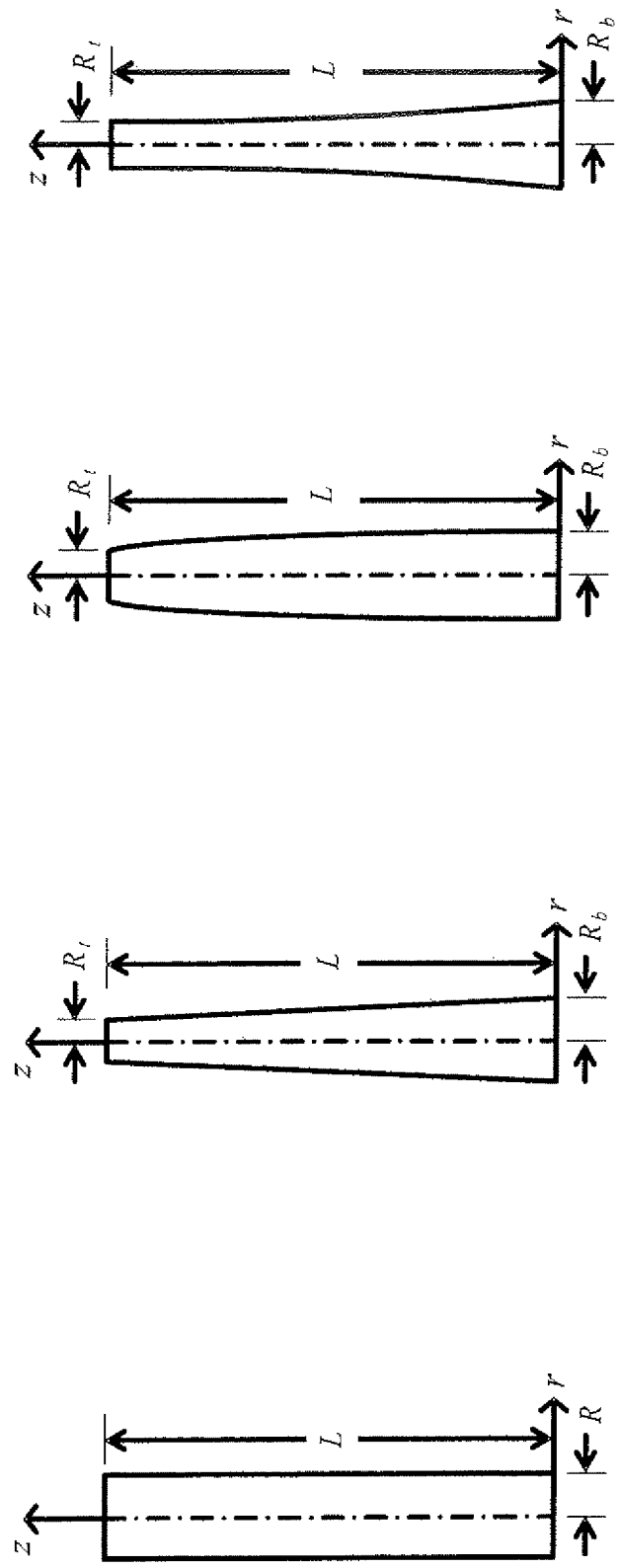

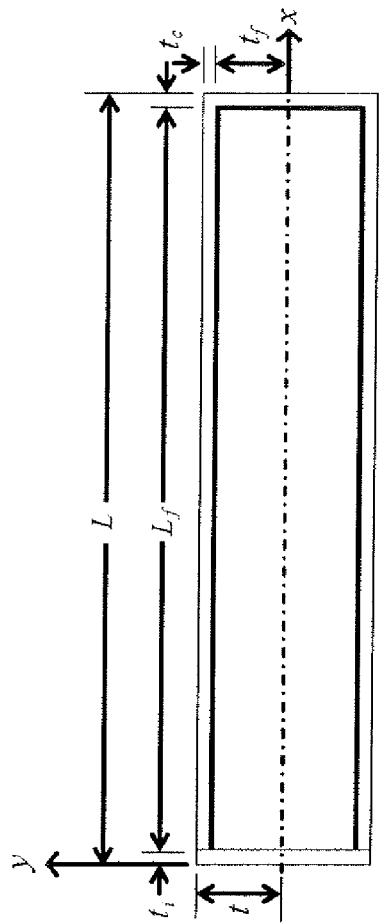
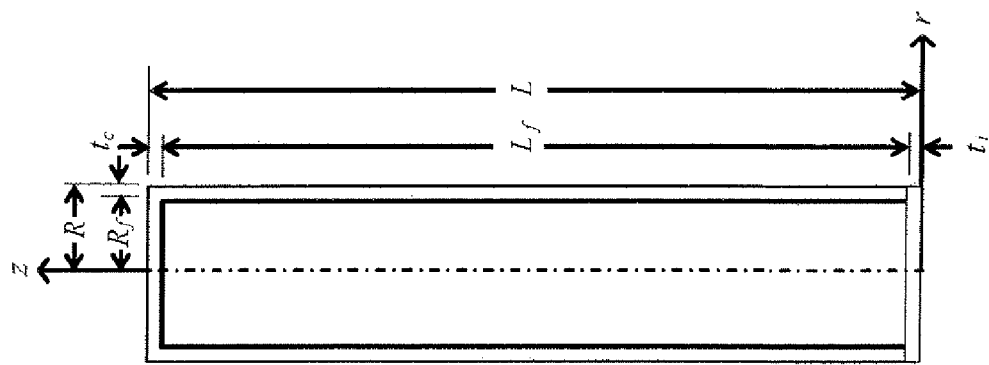

| Fin Profile | Fin Only | | | Fin + Coating | | | | Fin + TIM + Coating | | | |
|---|---|---|---|---|---|---|---|---|---|---|---|
| | $\bar{Q}$ (-) | $Q_{ND}$ (W) | $Q_{ANSYS}$ (W) | Diff. (%) | $\bar{Q}$ (-) | $Q_{ND}$ (W) | $Q_{ANSYS}$ (W) | Diff. (%) | $\bar{Q}$ (-) | $Q_{ND}$ (W) | $Q_{ANSYS}$ (W) | Diff. (%) |
| Cylindrical | 4.91 | 138.46 | 138.40 | 0.04 | 4.90 | 139.70 | 139.45 | 0.18 | 4.72 | 135.24 | 135.13 | 0.08 |
| Taper | 3.26 | 91.93 | 91.65 | 0.31 | 3.26 | 92.94 | 92.72 | 0.24 | 3.19 | 91.40 | 91.27 | 0.15 |
| Convex Parabolic | 3.84 | 108.29 | 107.60 | 0.64 | 3.83 | 109.20 | 108.66 | 0.49 | 3.71 | 106.30 | 106.35 | -0.05 |
| Concave Parabolic | 2.63 | 74.17 | 73.64 | 0.71 | 2.64 | 75.27 | 74.68 | 0.79 | 2.59 | 74.21 | 74.04 | 0.23 |

Dimensionless Parameters: $k_{cf} = 0.04$, $k_{tf} = 0.1$, $\zeta = 10$, $r_{tb} = 0.25$, $t_{cf} = 0.01$, $t_{tf} = 0.05$, $Bi r_f = 0.005$, $\theta_b = 2$ Dimensional Parameters: $k_f = 376$ W/m-°K, $k_t = 40$ W/m-°K, $h = 376$ W/m²-°K, $R_b = 5$ mm, $R_t = 1.25$ mm, $L_f = 50$ mm, $t_c = 50$ μm, $t_i = 250$ μm, $T_b = 600$ K, $T_\infty = 300$ °K

*Fig. 11*

| Fin Profile | Fin Only | | | Fin + Coating | | | | Fin + TIM + Coating | | |
|---|---|---|---|---|---|---|---|---|---|---|
| | $\bar{Q}$ (-) | $Q_{ND}$ (W) | $Q_{ANSYS}$ (W) | Diff. (%) | $\bar{Q}$ (-) | $Q_{ND}$ (W) | $Q_{ANSYS}$ (W) | Diff. (%) | $Q_{ND}$ (W) | $Q_{ANSYS}$ (W) | Diff. (%) |
| Rectangular | 0.9211 | 5194.9 | 5190.1 | 0.07 | 0.9204 | 5196.2 | 5191.5 | 0.09 | 5104.8 | 5103.3 | 0.03 |
| Taper | 0.8474 | 4779.6 | 4772.0 | 0.16 | 0.8463 | 4777.9 | 4773.3 | 0.10 | 4704.2 | 4702.9 | 0.03 |
| Convex Parabolic | 0.8671 | 4890.2 | 4871.8 | 0.38 | 0.8665 | 4891.9 | 4873.5 | 0.38 | 4800.1 | 4799.0 | 0.02 |
| Concave Parabolic | 0.8208 | 4629.2 | 4610.2 | 0.41 | 0.8199 | 4628.9 | 4611.1 | 0.39 | 4548.2 | 4547.2 | 0.02 |

Dimensionless Parameters: $k_{cf} = 0.04$, $k_{tf} = 0.1$, $\zeta = 10$, $t_{tb} = 0.25$, $t_{cf} = 0.01$, $t_{if} = 0.05$, $Bi r_f = 0.005$, $\theta_b = 2$ Dimensional Parameters: $k_f = 376$ W/m-°K, $k_{tf} = 376$ W/m-°K, $k_i = 15$ W/m-°K, $h = 376$ W/m²-°K, $t_b = 5$ mm, $R_t = 1.25$ mm, $L_f = 50$ mm, $t_c = 50$ μm, $t_i = 250$ μm, $T_b = 600$ K, $T_\infty = 300$ °K

*Fig. 12*

METHOD OF MODELING THERMAL PROBLEMS USING A NON-DIMENSIONAL FINITE ELEMENT METHOD

BACKGROUND OF THE INVENTION

1. Field of the Invention

The present invention relates to computerized methods and systems for modeling thermal systems, and particularly to a method of modeling thermal problems using a non-dimensional finite element method that relies on the variational principle.

2. Description of the Related Art

The application of non-dimensional analysis is very common for heat transfer problems, where most of the experimental correlations are given as a function of non-dimensional groups. However, in order to generate numerical solutions for the differential and integral equations of thermal systems, which may not have analytical solutions, the solution of heat transfer problems is commonly based on finite element or finite volume, using quantities with dimensions.

Conventionally, a commercial finite element method-based system, such as ANSYS (which is basically a dimensional code), is used for the solution of dimensional problems, and then the finite element results are converted into non-dimensional form. Rather than performing this two-step process, which may be very heavy on computational power and time, it would be desirable to obtain the finite element formulation in a non-dimensional form such that the finite element results may be directly produced without dimensions.

Further, conventional finite element techniques are only valid for a specific problem. It would be desirable to provide a general non-dimensional finite element method that is valid for an entire class of problems.

Thus, a method of modeling thermal problems using a non-dimensional finite element method solving the aforementioned problems is desired.

SUMMARY OF THE INVENTION

The method of modeling thermal problems using a non-dimensional finite element method is a computerized method that includes the following steps: (a) establishing a steady state heat conduction equation in three dimensions for an orthotropic material as:

$$k_x \frac{\partial^2 T}{\partial x^2} + k_y \frac{\partial^2 T}{\partial y^2} + k_z \frac{\partial^2 T}{\partial z^2} + G = 0,$$

where the domain has surface areas $S_1$, $S_2$ and $S_3$; where $T=T_b$ for $S_1$, $$k_x \frac{\partial T}{\partial x}\hat{l} + k_y \frac{\partial T}{\partial y}\hat{m} + k_z \frac{\partial T}{\partial z}\hat{n} + q^* = 0$$

for $S_2$, and $$k_x \frac{\partial T}{\partial x}\hat{l} + k_y \frac{\partial T}{\partial y}\hat{m} + k_z \frac{\partial T}{\partial z}\hat{n} + h(T - T_\infty) = 0$$

for $S_3$; and where $k_x$, $k_y$, and $k_z$ are thermal conductivities in Cartesian x, y and z-directions, respectively, G is a rate of internal heat generation per unit volume, T is temperature, $T_b$ and $T_\infty$ are specified and ambient temperatures, respectively, $q^*$ is a specified heat flux, h is a coefficient of convective heat transfer, and $\hat{l}$, $\hat{m}$ and $\hat{n}$ are surface normals, respectively, corresponding to the Cartesian x, y and z-directions; (b) establishing a scalar functional quantity $\Pi = U + \Omega_G \Omega_q + \Omega_h$, where U represents a term related to internal energy, $\Omega_G$ represents a term related to internal heat generation, $\Omega_h$ represents a term related to heat convection, and $\Omega_q$ represents a term related to heat conduction, and $$U = \frac{1}{2} \int \int\int_V \left[ k_x \left(\frac{\partial T}{\partial x}\right)^2 + k_y \left(\frac{\partial T}{\partial y}\right)^2 + k_z \left(\frac{\partial T}{\partial z}\right)^2 \right] dV,$$

$$\Omega_G = -\int\int\int_V GT dV,$$

$$\Omega_q = -\int\int_{S2} \int q^* T dS, \text{ and}$$

$$\Omega_h = \frac{1}{2} \int\int_{S3} h(T - T_\infty)^2 dS,$$

where V represents volume; and (c) establishing a set of non-dimensional parameters $$\theta = \frac{T}{T_\infty}, \bar{x} = \frac{x}{L_x}, \bar{y} = \frac{y}{L_y}, \text{ and } \bar{z} = \frac{z}{L_z},$$

where $\theta$ is non-dimensional temperature, $\bar{x}$, $\bar{y}$ and $\bar{z}$ are non-dimensional spatial variables, and $L_x$, $L_y$, and $L_z$ are maximum dimensions of a domain to be discretized along the x, y and z-directions, respectively.

The method further includes the steps of (d) expressing the scalar functional quantity in matrix form as:

$$\frac{\Pi}{hT_\infty^2} = \frac{1}{2} \int \int\int_V \{\bar{g}\}^T [\bar{L}]\{\bar{g}\} dV - \int\int_{S2} \{\theta\}^T [\bar{N}]^T \bar{q}^* dS + \frac{1}{2} \int\int_{S3} (\{\theta\}^T [\bar{N}]^T - 1)^2 dS,$$

where $[\bar{N}]$ is a shape function matrix, $\{\bar{g}\}$ is a non-dimensional temperature gradient vector, $\{\theta\}$ is a non-dimensional temperature vector, $[\bar{D}]$ is a non-dimensional material property matrix, and $[\bar{L}]$ is a geometric dimensions ratio matrix, wherein $$\{\bar{g}\} = \left[\frac{\partial \theta}{\partial \bar{x}} \frac{\partial \theta}{\partial \bar{y}} \frac{\partial \theta}{\partial \bar{z}}\right]^T \text{ and } \{\bar{g}\} = [\bar{B}]\{\theta\},$$

where:

$$[\bar{B}] = \left[\frac{\partial [\bar{N}]}{\partial \bar{x}} \frac{\partial [\bar{N}]}{\partial \bar{y}} \frac{\partial [\bar{N}]}{\partial \bar{z}}\right]^T, \text{ and}$$

-continued $$[\overline{D}] = \begin{bmatrix} 1/Bi_x & 0 & 0 \\ 0 & 1/Bi_y & 0 \\ 0 & 0 & 1/Bi_z \end{bmatrix}, [\overline{L}] = \begin{bmatrix} 1 & 0 & 0 \\ 0 & L_x/L_y & 0 \\ 0 & 0 & L_x/L_z \end{bmatrix},$$

where $Bi_x$, $Bi_y$ and $Bi_z$ are Biot numbers given by $$Bi_x = \frac{hL_x}{k_x}, Bi_y = \frac{hL_y}{k_y} \text{ and } Bi_z = \frac{hL_z}{k_z}$$

and non-dimensional specified heat flux $\overline{q}^*$ is given by $$\overline{q}^* = \frac{q^*}{hT_\infty};$$

(e) minimizing a dimensionless scalar functional quantity given as $\overline{\Pi} = \Pi/hT_\infty^2 L_y L_z$ with respect to $\{\overline{\theta}\}$ to yield:

$$\left[\iiint_{\overline{V}} [\overline{B}]^T [\overline{L}][\overline{D}][\overline{B}] d\overline{V} + \iint_{\overline{S3}} [[\overline{N}]^T [\overline{N}]] d\overline{S}\right] \{\overline{\theta}\} = \iint_{\overline{S2}} [\overline{N}]^T \overline{q}^* d\overline{S} + \iint_{\overline{S3}} [\overline{N}]^T d\overline{S}.$$

Continuing further, the method provides for: (f) calculating an element stiffness matrix as $[\overline{k}] = [\overline{k}_q] + [\overline{k}_h]$, where $$[\overline{k}_q] = \iiint_{\overline{V}} [\overline{B}]^T [\overline{L}][\overline{D}][\overline{B}] d\overline{V} \text{ and } [\overline{k}_h] = \iint_{\overline{S3}} [[\overline{N}]^T [\overline{N}]] d\overline{S};$$

and (g) calculating an element load vector as $\{\overline{f}\} = \{\overline{f}_q\} + \{\overline{f}_h\}$, where:

$$[\overline{f}_q] = \iint_{\overline{S2}} [\overline{N}]^T \overline{q}^* d\overline{S} \text{ and } [\overline{f}_h] = \iint_{\overline{S3}} [\overline{N}]^T d\overline{S}.$$

These and other features of the present invention will become readily apparent upon further review of the following specification and drawings.

BRIEF DESCRIPTION OF THE DRAWINGS

FIG. 2A illustrates a linear square element in natural s-t coordinates.

FIG. 2B illustrates a square element mapped into quadrilateral in global $(\overline{r}, \overline{z})$ coordinates.

FIG. 3A illustrates a linear square element in natural s-t coordinates.

FIG. 3B illustrates a square element mapped into quadrilateral in global $(\overline{x}, \overline{y})$ coordinates.

FIG. 5A diagrammatically illustrates a rectangular pin fin in profile.

FIG. 5B diagrammatically illustrates a tapered pin fin in profile.

FIG. 5C diagrammatically illustrates a convex parabolic pin fin in profile.

FIG. 5D diagrammatically illustrates a concave parabolic pin fin in profile.

FIG. 7A diagrammatically illustrates a composite pin fin with thermal interface material.

FIG. 7B diagrammatically illustrates a composite longitudinal fin with thermal interface material.

FIG. 11 is a table comparing results produced by the method of modeling thermal problems using a non-dimensional finite element method according to the present invention against results produced by conventional prior art methods, as applied to a pin fin.

FIG. 12 is a table comparing results produced by the method of modeling thermal problems using a non-dimensional finite element method according to the present invention against results produced by conventional prior art methods, as applied to a longitudinal fin.

Similar reference characters denote corresponding features consistently throughout the attached drawings.

DETAILED DESCRIPTION OF THE PREFERRED EMBODIMENTS

Figure 1:
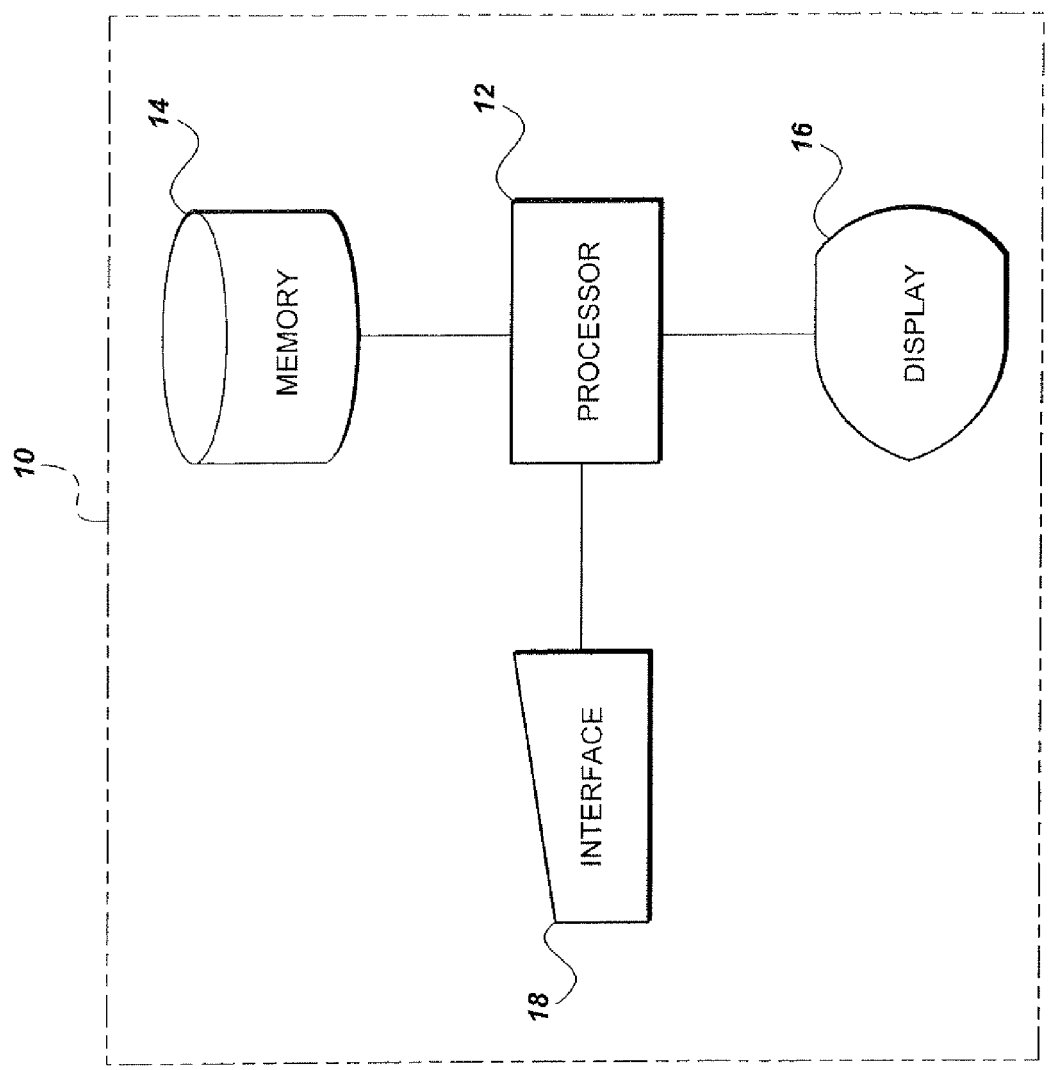
FIG. 1 is a block diagram illustrating system components for implementing the method of modeling thermal problems using a non-dimensional finite element method according to the present invention.

The present invention relates to a computerized method of modeling thermal problems using a non-dimensional finite element method. Particularly, the non-dimensional finite element method relies on the variational principle. The variational principle specifies the total potential of the system, given by a scalar quantity Π, which is defined by an integral form for a continuum problem. The solution of the continuum problem is a function that makes Π stationary with respect to the state variables. The governing equation of the problem is used to calculate the potential Π.

The governing differential equation for steady state heat conduction in three dimensions for an orthotropic material is given as:

$$k_x \frac{\partial^2 T}{\partial x^2} + k_y \frac{\partial^2 T}{\partial y^2} + k_z \frac{\partial^2 T}{\partial z^2} + G = 0 \qquad (1)$$

with the following boundary conditions on surfaces $S_1$, $S_2$ and $S_3$, respectively:

$$\begin{cases} T = T_b \\ k_x \frac{\partial T}{\partial x}\hat{l} + k_y \frac{\partial T}{\partial y}\hat{m} + k_z \frac{\partial T}{\partial z}\hat{n} + q^* = 0 \\ k_x \frac{\partial T}{\partial x}\hat{l} + k_y \frac{\partial T}{\partial y}\hat{m} + k_z \frac{\partial T}{\partial z}\hat{n} + h(T - T_\infty) = 0 \end{cases} \qquad (2)$$

where, $k_x$, $k_y$ and $k_z$ are the thermal conductivities in the Cartesian x, y and z-directions, respectively. G is the rate of internal heat generation per unit volume, $T_b$ and $T_\infty$ are specified and ambient temperatures, respectively, q* is the specified heat flux, h is the coefficient of convective heat transfer, and $\hat{l}$, $\hat{m}$ and $\hat{n}$ are the surface normals.

The total potential for the heat transfer problem is given by:

$$\Pi = U + \Omega_G + \Omega_q + \Omega_h \qquad (3)$$

where the four terms on the right hand side are associated with internal energy U, internal heat generation $\Omega_G$, heat convection $\Omega_h$ and heat conduction $\Omega_q$. For the governing equation (1) with associated boundary conditions (2), these terms may be written as equation set (4):

$$U = \frac{1}{2} \int\int\int_V \left[ k_x \left(\frac{\partial T}{\partial x}\right)^2 + k_y \left(\frac{\partial T}{\partial y}\right)^2 + k_z \left(\frac{\partial T}{\partial z}\right)^2 \right] dV$$

$$\Omega_G = -\int\int\int_V GT dV$$

$$\Omega_q = -\int\int_{S2} q^* T dS$$

$$\Omega_h = \frac{1}{2} \int\int_{S3} h(T - T_\infty)^2 dS$$

where $S_2$ and $S_3$ are separate surface areas over which heat flux q* and convection loss $h(T-T_\infty)$ are specified because they cannot occur simultaneously on the same surface. It should be noted that heat flux q* is positive into the surface. In the case of no internal heat generation, equation (3) reduces to:

$$\Pi = \frac{1}{2} \int\int\int_V \left[ k_x \left(\frac{\partial T}{\partial x}\right)^2 + k_y \left(\frac{\partial T}{\partial y}\right)^2 + k_z \left(\frac{\partial T}{\partial z}\right)^2 \right] dV - \qquad (5)$$

-continued $$\int\int_{S2} q^* T dS + \frac{1}{2} \int\int_{S3} h(T - T_\infty) dS.$$

In order to generate the non-dimensional form of the potential Π, the following non-dimensional variables must be defined:

$$\theta = \frac{T}{T_\infty}, \bar{x} = \frac{x}{L_x}, \bar{y} = \frac{y}{L_y}, \text{ and } \bar{z} = \frac{z}{L_z} \qquad (6)$$

where θ is the non-dimensional temperature, $\bar{x}$, $\bar{y}$ and $\bar{z}$ are non-dimensional spatial variables, and $L_x$, $L_y$ and $L_z$ are the maximum dimensions of the domain to be discretised along the x, y and z-directions, respectively.

The potential given by equation (5) may be expressed in terms of defined non-dimensional parameters as follows:

$$\frac{\Pi}{hT_\infty^2} = \qquad (7)$$

$$\frac{1}{2} \int\int\int_V \left[ \frac{1}{L_x} \frac{1}{Bi_x} \left(\frac{\partial \theta}{\partial \bar{x}}\right)^2 + \frac{1}{L_y} \frac{1}{Bi_y} \left(\frac{\partial \theta}{\partial \bar{y}}\right)^2 + \frac{1}{L_z} \frac{1}{Bi_z} \left(\frac{\partial \theta}{\partial \bar{z}}\right)^2 \right] dV -$$

$$\int\int_{S2} \bar{q}^* \theta dS + \frac{1}{2} \int\int_{S3} (\theta - 1)^2 dS$$

where $$\bar{q}^* = \frac{q^*}{hT_\infty} \qquad (8)$$

is the non-dimensional specified heat flux, and $$Bi_x = \frac{hL_x}{k_x}, Bi_y = \frac{hL_y}{k_y} \text{ and } Bi_z = \frac{hL_z}{k_z}$$

are Biot numbers.

The potential given by equation (7) may be written in matrix form as $$\frac{\Pi}{hT_\infty^2} = \frac{1}{2} \int\int\int_V \{\bar{g}\}^T [\bar{L}] \{\bar{g}\} dV - \qquad (9)$$

$$\int\int_{S2} \{\theta\}^T [\bar{N}]^T \bar{q}^* dS + \frac{1}{2} \int\int_{S3} \left( \{\theta\}^T [\bar{N}]^T - 1 \right)^2 dS$$

where $[\bar{N}]$ is the shape function matrix, $\{\bar{g}\}$ is the non-dimensional temperature gradient vector, $[\bar{D}]$ is the non-dimensional material property matrix, and $[\bar{L}]$ is the geometric dimensions ratio matrix, given by $$\{\bar{g}\} = \begin{bmatrix} \frac{\partial \theta}{\partial \bar{x}} & \frac{\partial \theta}{\partial \bar{y}} & \frac{\partial \theta}{\partial \bar{z}} \end{bmatrix}^T$$

or $\{\bar{g}\} = [\bar{B}]\{\theta\}$ with $$[\bar{B}] = \left[ \begin{array}{ccc} \frac{\partial [\bar{N}]}{\partial \bar{x}} & \frac{\partial [\bar{N}]}{\partial \bar{y}} & \frac{\partial [\bar{N}]}{\partial \bar{z}} \end{array} \right]^T,$$

and $$[\bar{D}] = \begin{bmatrix} \frac{1}{Bi_x} & 0 & 0 \\ 0 & \frac{1}{Bi_y} & 0 \\ 0 & 0 & \frac{1}{Bi_z} \end{bmatrix}, [\bar{L}] = \begin{bmatrix} 1 & 0 & 0 \\ 0 & \frac{L_x}{L_y} & 0 \\ 0 & 0 & \frac{L_x}{L_z} \end{bmatrix}. \quad (10)$$

By putting $\{\bar{g}\}=[\bar{B}]\{\theta\}$ and dividing by $L_y L_z$ to transform the functional into dimensionless form, equation (9) becomes:

$$\frac{\Pi}{hT_\infty^2 L_y L_z} = \qquad (11)$$

$$\frac{1}{2}\int\int\int_V \{\theta\}^T [\bar{B}]^T [\bar{L}][\bar{D}][\bar{B}]\{\theta\} d\bar{V} - \int\int_{\bar{S}2} \{\theta\}^T [\bar{N}]^T \bar{q}^* d\bar{S} +$$

$$\frac{1}{2}\int\int_{\bar{S}3} \left[ \{\theta\}^T [\bar{N}]^T [\bar{N}]\{\theta\} - 2\{\theta\}^T [\bar{N}]^T + 1 \right] d\bar{S}$$

where $\bar{\Pi} = \Pi/hT_\infty^2 L_y L_z$ is the dimensionless form of the functional while $d\bar{V}$ and $d\bar{S}$ are non-dimensional differential volume and surface area elements respectively.

The non-dimensional finite element method can now be formulated by invoking the stationarity of the dimensionless potential $\bar{\Pi}$ with respect to $\{\theta\}$. In fact, $\{\theta\}$ can be taken out of the integral in (11), as it is independent of the general coordinate system, yielding:

$$\bar{\Pi} = \frac{1}{2}\{\theta\}^T \int\int\int_V [\bar{B}]^T [\bar{L}][\bar{D}][\bar{B}]\{\theta\} d\bar{V} - \{\theta\}^T \int\int_{\bar{S}2} [\bar{N}]^T \bar{q}^* d\bar{S} + \qquad (12)$$

$$\frac{1}{2}\int\int_{\bar{S}3} \left[ \{\theta\}^T [\bar{N}]^T [\bar{N}]\{\theta\} - 2\{\theta\}^T [\bar{N}]^T + 1 \right] d\bar{S}$$

and the minimization of $\bar{\Pi}$ with respect to $\{\theta\}$ yields:

$$\left[ \int\int\int_V [\bar{B}]^T [\bar{L}][\bar{D}][\bar{B}] d\bar{V} + \int\int_{\bar{S}3} [[\bar{N}]^T [\bar{N}]] d\bar{S} \right]\{\theta\} = \qquad (13)$$

$$\int\int_{\bar{S}2} [\bar{N}]^T \bar{q}^* d\bar{S} + \int\int_{\bar{S}3} [\bar{N}]^T d\bar{S}.$$

Equation (13) is of the form:

$$[\bar{k}]\{\theta\}=\{\bar{f}\}, \qquad (14)$$

Thus, the element stiffness matrix and load vectors may be deduced as $[\bar{k}]=[\bar{k}_q]+[\bar{k}_h]$, with $$[\bar{k}_q] = \int\int\int_V [\bar{B}]^T [\bar{L}][\bar{D}][\bar{B}] d\bar{V} \text{ and } [\bar{k}_h] = \int\int_{\bar{S}3} [[\bar{N}]^T [\bar{N}]] d\bar{S}. \qquad (15)$$

Similarly, $\{\bar{f}\}=\{\bar{f}_q\}+\{\bar{f}_h\}$, with:

$$[\bar{f}_q] = \int\int_{\bar{S}2} [\bar{N}]^T \bar{q}^* d\bar{S} \text{ and } [\bar{f}_h] = \int\int_{\bar{S}3} [\bar{N}]^T d\bar{S}. \qquad (16)$$

It may be observed that the derived formulation is in general form. In the following, the general form is used to obtain the formulations for two-dimensional plane and axisymmetric cases by inserting the corresponding values of $[\bar{B}]$, $[\bar{L}]$, $[\bar{D}]$, $[\bar{N}]$ and integrating over element non-dimensional volume and surface areas. The objective of deriving the two-dimensional formulations is to validate the derived formulation and to demonstrate its use in providing the solution to a class of problems with a single finite element solution.

An isoparametric quadrilateral element having four degrees of freedom, $\theta_1$, $\theta_2$, $\theta_3$ and $\theta_4$ associated with the global non-dimensional $\bar{r}$-$\bar{z}$ coordinates is considered. The element has arbitrary shape but straight sides, as shown in FIG. 2B. The non-dimensional coordinates are defined as (with reference to equation (6)):

$$\bar{r} = \frac{r}{L_r} \text{ and } \bar{z} = \frac{z}{L_z} \qquad (17)$$

where the parameters $L_r$ and $L_z$ are the largest radius and largest length of the axisymmetric domain to be discretized, respectively.

The term isoparametric refers to the use of the same shape functions to define the element shapes as well as the temperature within an element. Therefore, the element shape is defined as follows:

$$\begin{Bmatrix} \bar{r} \\ \bar{z} \end{Bmatrix} = \begin{bmatrix} \bar{N}_1 & 0 & \bar{N}_2 & 0 & \bar{N}_3 & 0 & \bar{N}_4 & 0 \\ 0 & \bar{N}_1 & 0 & \bar{N}_2 & 0 & \bar{N}_3 & 0 & \bar{N}_4 \end{bmatrix} \begin{Bmatrix} \bar{r}_1 \\ \bar{z}_1 \\ \bar{r}_2 \\ \bar{z}_2 \\ \bar{r}_3 \\ \bar{z}_3 \\ \bar{r}_4 \\ \bar{z}_4 \end{Bmatrix}. \qquad (18)$$

Similarly, the non-dimensional temperature is defined as:

$$\theta = [\bar{N}_1 \ \bar{N}_2 \ \bar{N}_3 \ \bar{N}_4] \begin{Bmatrix} \theta_1 \\ \theta_2 \\ \theta_3 \\ \theta_4 \end{Bmatrix} \text{ or } \theta = [\bar{N}]\{\theta\}, \qquad (19)$$

where $[\bar{N}]$ is the matrix of shape functions. Linear shape functions are also considered, and are given by equation set (20):

$$\bar{N}_1 = \frac{1}{4}(1-s)(1-t);$$

$$\bar{N}_2 = \frac{1}{4}(1+s)(1-t);$$

$$\overline{N}_3 = \frac{1}{4}(1+s)(1+t); \text{ and}$$

$$\overline{N}_4 = \frac{1}{4}(1-s)(1+t).$$

The element stiffness matrix may now be expressed in terms of s-t coordinates. From equation (15), the element stiffness matrix is:

$$[\overline{k}] = \iiint_{\overline{V}} [\overline{B}]^T [\overline{L}][\overline{D}][\overline{B}] d\overline{V} + \iint_{\overline{S3}} \lfloor [\overline{N}]^T [\overline{N}] \rfloor d\overline{S},$$

where the differential volume $d\overline{V}$ and area $d\overline{S}$ can be obtained as:

$$d\overline{V} = 2\pi \overline{r}_m d\overline{A} \text{ and } d\overline{S} = 2\pi \overline{r} d\overline{l}, \tag{21}$$

where $$\overline{r}_m = \frac{1}{n}\sum_{i=1}^{n}\overline{r}_i;\ \overline{A} = \frac{A}{L_r L_z};\ \text{and}\ \overline{l} = \frac{l}{L_z}, \tag{22}$$

where $\overline{r}_m$ is the mean non-dimensional radius for the n-node element, $\overline{A}$ is the element non-dimensional area, and $\overline{l}$ is the element edges' non-dimensional length. Thus, the element stiffness matrix may be written as:

$$[\overline{k}] = \overline{r}_m \iint_{\overline{A}} [\overline{B}]^T [\overline{L}][\overline{D}][\overline{B}] d\overline{r} d\overline{z} + \int_{\overline{l}2} \lfloor [\overline{N}]^T [\overline{N}] \rfloor \overline{r} d\overline{l}, \tag{23}$$

with $$[\overline{D}] = \begin{bmatrix} \frac{1}{Bi_r} & 0 \\ 0 & \frac{1}{Bi_z} \end{bmatrix}; [\overline{L}] = \begin{bmatrix} 1 & 0 \\ 0 & \frac{1}{\zeta} \end{bmatrix}; \zeta = \frac{L_z}{L_r}, \tag{24}$$

where $[\overline{D}]$ is the non-dimensional material property matrix, $[\overline{L}]$ is the geometric dimension ratio matrix, and $\zeta$ is the aspect ratio of the domain to be discretized.

It should be noted that $\overline{r}_m$ and the flux-temperature matrix $[\overline{B}]$ may be expressed in terms of natural coordinates by using equations (10), (18) and (20), whereas the material property matrix $[\overline{D}]$ and geometric ratio matrix $[\overline{L}]$ are constants for given material and geometry. Nevertheless, the element surface and length over which the integration has to be carried out must be expressed in terms of s-t coordinates with an appropriate change of integration limits. The standard transformation procedure that involves the Jacobian (i.e., the determinant |J|) is given by:

$$\iint_A f(r,z) d\overline{r} d\overline{z} = \iint_A f(s,t)|J| ds dt. \tag{25}$$

The transformation is valid irrespective of the number of coordinates used. Therefore, for the element non-dimensional edge length $d\overline{l}$:

$$\int_{\overline{l}} f(\overline{r},\overline{z}) d\overline{l} = \int_{-l}^{l} f(s)|J(s)| ds \text{ for constant } t \tag{26}$$

$$\int_{\overline{l}} f(\overline{r},\overline{z}) d\overline{l} = \int_{-l}^{l} f(t)|J(t)| dt \text{ for constant } s,$$

where $|J(s)|$ and $|J(t)|$ are one-dimensional Jacobians related to an element edge with constant t and s, respectively, as described in greater detail below.

The convection or transfer of heat flux may only occur through the element edges (i.e., the sides 1-2, 2-3, 3-4 or 4-1 in FIGS. 2A and 2B). As the quadrilateral element in the $\overline{r}$-$\overline{z}$ plane becomes a square element in the s-t plane, on each element edge either s or t becomes constant. This explains why the element edges' non-dimensional length $d\overline{l}$ is transformed in either $|J(s)|ds$ or $|J(t)|dt$.

Thus, for the isoparametric quadrilateral element of FIG. 2B, equation (23) becomes:

$$[\overline{k}] = \overline{r}_m \int_{-1}^{1}\int_{-1}^{1} [\overline{B}]^T [\overline{L}][\overline{D}][\overline{B}]|J| ds dt + \int_{-1}^{1} [\overline{N}]^T [\overline{N}]|J(s)|\overline{r}(s,t) ds, \tag{27}$$

where equation (27) considers that convection occurs from the element edge with constant t.

$|J|$ and $[\overline{B}]$ result in relatively complicated expressions within the integral of equation (27), thus the integration is performed using any suitable numerical integration technique.

From equation (15), the element force vector is given by $$\{\overline{f}\} = \int_{\overline{l}2} [\overline{N}]^T \overline{q}^* \overline{r} d\overline{l} + \int_{\overline{l}3} [\overline{N}]^T \overline{r} d\overline{l},$$

which may be written as:

$$\{\overline{f}\} = \int_{-1}^{1} [\overline{N}]^T |J(t)|\overline{q}^*(s,t)\overline{r}(s,t) dt + \int_{-1}^{1} [\overline{N}]^t |J(s)|\overline{r}(s,t) ds, \tag{28}$$

where equation (28) assumes that the convection occurs from the element edge with constant t, whereas the flux is specified on the edge with constant s.

Similar to the isoparametric axisymmetric element, the isoparametric plane element is shown in FIG. 3B (with the linear square element of FIG. 3A resembling that of FIG. 2A). From equation (6), the non-dimensional coordinates are defined as $$\overline{x} = \frac{x}{L_x} \text{ and } \overline{y} = \frac{y}{L_y}.$$

As in the above, the element shapes and temperature within an element are described as:

$$\left\{\begin{matrix}\bar{x}\\ \bar{y}\end{matrix}\right\} = \begin{bmatrix} \bar{N}_1 & 0 & \bar{N}_2 & 0 & \bar{N}_3 & 0 & \bar{N}_4 & 0 \\ 0 & \bar{N}_1 & 0 & \bar{N}_2 & 0 & \bar{N}_3 & 0 & \bar{N}_4 \end{bmatrix} \left\{\begin{matrix}\bar{x}_1\\ \bar{y}_1\\ \bar{x}_2\\ \bar{y}_2\\ \bar{x}_3\\ \bar{y}_3\\ \bar{x}_4\\ \bar{y}_4\end{matrix}\right\} \quad (29)$$

$$\theta = [\bar{N}]\{\theta\}, \quad (30)$$

noting that the shape functions are the same as for the axisymmetric element.

The element stiffness matrix may be obtained by following a similar mathematical method as described above:

$$[\bar{k}] = \int_{-1}^{1}\int_{-1}^{1}[\bar{B}]^T[L][\bar{D}][\bar{B}]J\left|dsdt + \int_{-1}^{1}[\bar{N}]^T[\bar{N}]J(s)\right|ds, \quad (31)$$

where equation (31) considers that the convection occurs from element edges with constant t.

The element force vector is given as:

$$\{\bar{f}\} = \int_{-1}^{1}[\bar{N}]^T|J(t)|\bar{q}^*(s,t)dt + \int_{-1}^{1}[\bar{N}]^T|J(s)|ds, \quad (32)$$

where it is assumed that the convection occurs from element edges with constant t, whereas the flux is specified on edges with constant s.

In the following, the nominal cases for axisymmetric and plane elements are solved in order to demonstrate the efficiency of the non-dimensional finite element method, with the accuracy thereof being compared with solutions produced by commercial finite element software ANSYS.

Figure 4B:
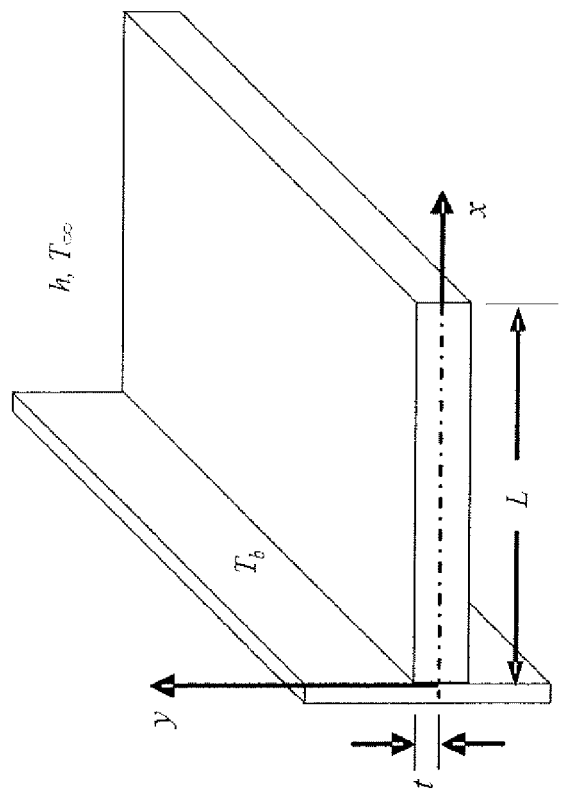
FIG. 4B diagrammatically illustrates a longitudinal fin to be modeled by method of modeling thermal problems using a non-dimensional finite element method according to the present invention.
Figure 4A:
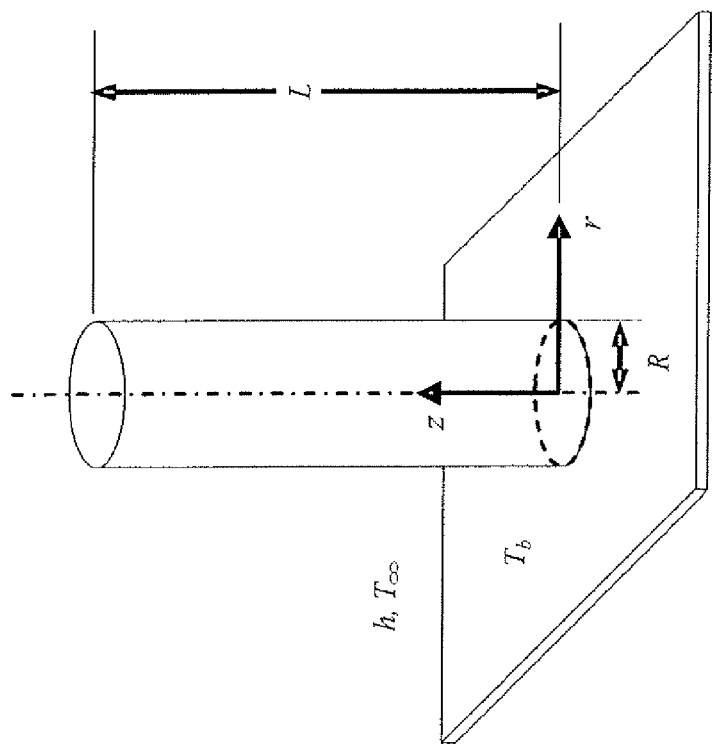
FIG. 4A diagrammatically illustrates a pin fin to be modeled by method of modeling thermal problems using a non-dimensional finite element method according to the present invention.
Figure 6B:
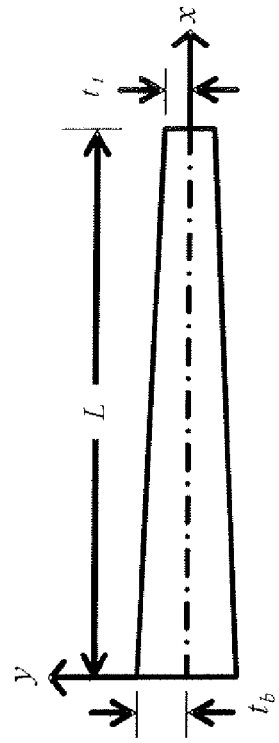
FIG. 6B diagrammatically illustrates a trapezoidal longitudinal fin in profile.
Figure 6D:
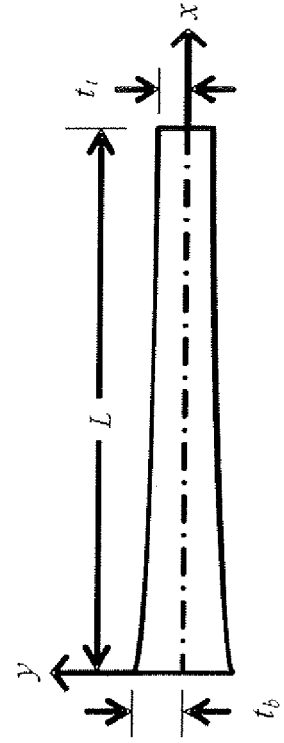
FIG. 6D diagrammatically illustrates a concave parabolic longitudinal fin in profile.
Figure 6A:
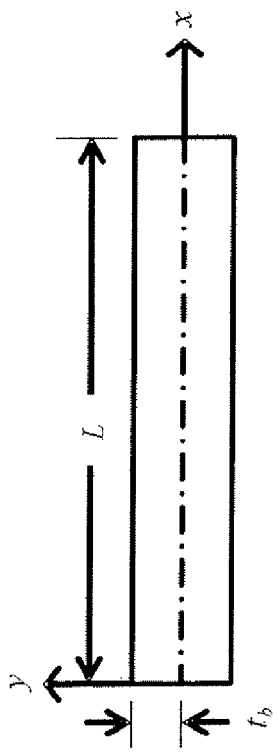
FIG. 6A diagrammatically illustrates a rectangular longitudinal fin in profile.
Figure 6C:
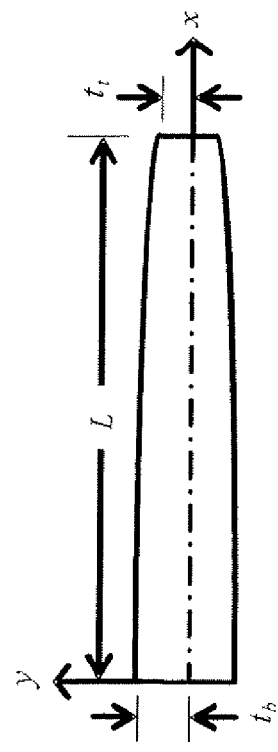
FIG. 6C diagrammatically illustrates a convex parabolic longitudinal fin in profile.

The significance of the dimensionless finite element formulation can be well utilized by constructing design charts for the problems that do not have analytical solutions; e.g., a composite fin. A composite fin is formed from a substrate (i.e., fin base material) and a coating, each being formed from different materials. A typical example is scale formation over the fin surface, caused by the operating environment. Depending on the application, a coating layer can also be applied to the fin surface to either protect it from a harsh working environment or, in some cases, to enhance its performance. The pin fin geometry of FIG. 4A and the longitudinal fin geometry of FIG. 4B are used in the following analysis.

FIGS. 5A-5D illustrate profiles for varying pin fin geometries, and FIGS. 6A-6D similarly illustrate profiles for varying longitudinal fin geometries. The profiles are described by:

$$r = R_t + (R_b - R_t)\left(\frac{L-z}{L}\right)^n \text{ and} \quad (33)$$

$$y = t_t + (t_b - t_t)\left(\frac{L-x}{L}\right)^n \quad (34)$$

where n=0, 1, 0.5 and 2 for rectangular, tapered, convex parabolic and concave parabolic profiles, respectively. $R_t=R_b$ ($t_t=t_b$) for rectangular profile fins.

Rectangular profile composite fins with thermal interfaces are illustrated in FIG. 7 in order to describe different geometric dimensions. The interface is considered to be a thermal interface material, as described below. Depending on the fin and prime surface materials and the manufacturing process, the fins are manufactured as the integral part of the prime surface, or they are attached through a joining process. If the fins are attached to the prime surface by a joining process, the surface roughness of the mating surfaces at the interface is composed of discrete micro-contact spots with trapped air in interstitial gaps.

The interface resistance appears due to low thermal conductivity of the trapped air. This problem can be overcome by using thermal interface materials (TIM). TIM is typically a high conductive material that can be in the form of grease, compliant polymers, metallic foils, or phase change materials. TIM replaces the air contained in the gaps at non-conforming surfaces, thus reducing the interface resistance due to its high thermal conductivity. The interfaces at fin-TIM and TIM-prime surfaces may be considered to be ideal. Thus, the governing parameter for the thermal interface resistance would be the TIM thermal conductivity and its layer thickness. This approach is adopted in this analysis to show the effects of interface resistance on fin performance.

The governing dimensionless parameters for composite fins are the fin base material-to-coating thickness and thermal conductivity ratios. For this analysis, the parameters are selected from a practical application point of view. The composite longitudinal and annular fins of triangular and parabolic profiles are examined, and their combinations of practical fins and coating materials are given a thermal conductivity ratio in the range of 0.04-13.60 (i.e., $k_{cf}=k_c/k_f$, where subscripts c and f are for coating and fin base material, respectively). The coating thickness ranges from 30-80 µm, which is typically achieved by dipping and electroplating techniques. For the fin half thickness in the range 3-8 mm, the thickness ratio would vary in the range of $0.004 \leq t_{cf} \leq 0.03$. Therefore, the values of the conductivity and thickness ratios for the present analysis are selected as $k_{cf}=0.04$ and $t_{cf}=0.01$. Similarly, the governing dimensionless parameters for the interface resistance are $k_{if}=k_i/k_f$ and $t_{if}=t_i/t_f$. The values of these parameters are $k_{if}=0.1$ and $t_{if}=0.05$.

Figure 8B:
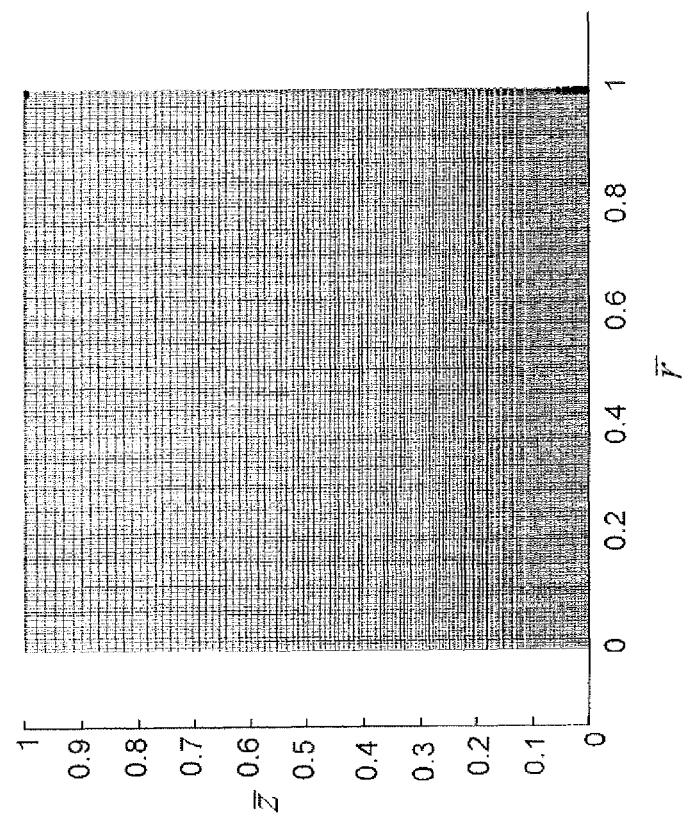
FIG. 8B is a graph illustrating a non-dimensional mesh for the rectangular pin fin with a coating ($\zeta=10$) of FIG. 8A.
Figure 8A:
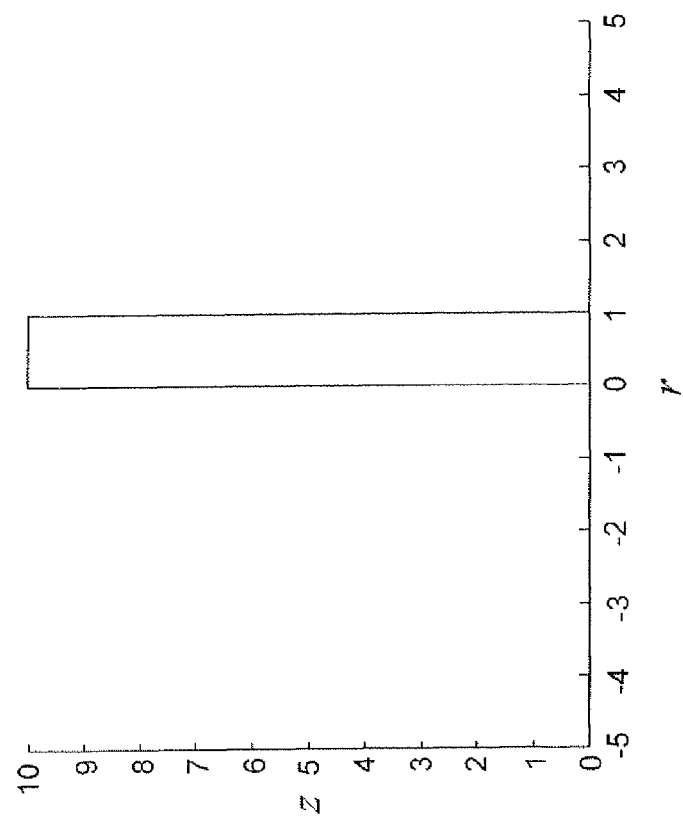
FIG. 8A is a graph illustrating an actual aspect ratio for a rectangular pin fin with a coating ($\zeta=10$).

In the following, solutions produced by commercial finite element (FE) software ANSYS are considered as the reference. Thermal element PLANE 55 is used for ANSYS FE models, which can be used for both axisymmetric and plane problems. Some test cases are selected for each fin profile for different composite fin configurations. Sufficiently fine mesh has been used for both non-dimensional and ANSYS FE models. The rectangular profile pin fin with coating is selected to depict a typical non-dimensional finite element mesh. For this case, the actual fin aspect ratio is shown in FIG. 8A. The dimensionless mesh of the fin is shown in FIG. 8B. It should be noted that the maximum dimensionless radius and length is equal to one. Further, the proportion of coating thickness is different in the radial and axial directions due to normalization (with reference to equation (6) above). Sufficiently fine mesh is used for the fin (150×150) so that it is fine near the base and coarse at the tip. The mesh size for the coating at the fin tip and the right edge is fine as well.

The results for total heat loss from the fins are compared in Table 1 (of FIG. 11) and Table 2 (of FIG. 12). It can be seen that the maximum difference does not exceed 0.79%. The dimensionless heat loss $\bar{Q}$ obtained through non-dimensional FE formulations has been converted into dimensional form $Q_{ND}$ by the following relation for the pin fin:

$$Q_{ND}=(hRLT_\infty)\overline{Q} \quad (35)$$

and for the longitudinal fin:

$$Q_{ND}=(hLT_\infty)\overline{Q}. \quad (36)$$

The effects of coating and thermal interface resistance can now be examined for different profile fins using non-dimensional finite elements. A fin without any coating or interface resistance is considered as the base case of the analysis. The results of the base case serve as a reference for the assessment of coating and interface thermal resistance effects. The dimensionless parameters of the base case are a fin aspect ratio of $(\zeta=L_f/R_f)=10$ or $(\zeta=L_f/t_f)=10$ (with fin base dimensions $R_b$ and $t_b$ used in the case of variable cross section fins); a fin tip to base ratio of $r_{tb}=R_t/R_t=0.25$ or $t_{tb}=t_t/t_b=0.25$ and a dimensionless base temperature of $(\theta_b=T_b/T_\infty)=2$. It should be noted that all considered cases are for convective fin tip boundary conditions, and that all materials have isotropic thermal properties.

The performance of the fin is described through its efficiency, which is given by:

$$\eta = \frac{Q_f}{Q_{f,max}} \quad (37)$$

where $Q_f$ is the heat loss by the fin and $Q_{f,max}$ is the maximum possible heat loss through the fin (i.e., a fin with no internal temperature gradient so that the complete fin is at the temperature equal to that of prime surface).

The fin efficiency is examined as a function of fin lateral Biot numbers, which are defined as:

$$Bir_f = \frac{hR_f}{k_f}; Biy_f = \frac{ht_f}{k_f} \quad (38)$$

where the subscript f is used to emphasize the fact that the parameters are for the fin only (i.e., without any coating or interface material). As in the above, the fin base dimensions $R_b$ and $t_b$ are used in the case of variable cross section fins.

Figure 9A:
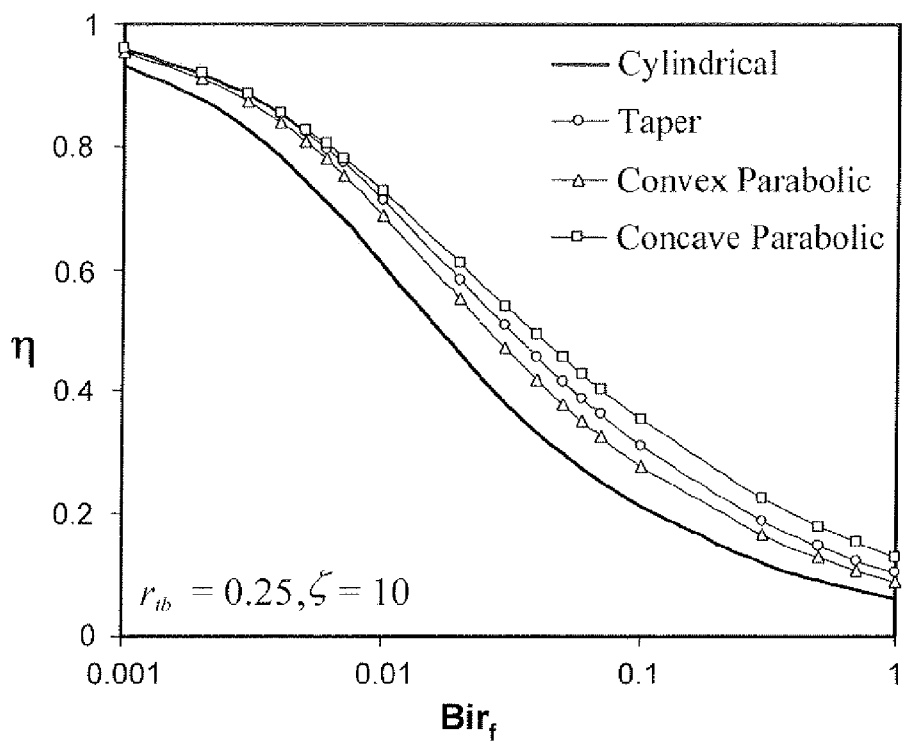
FIG. 9A is a graph illustrating efficiencies of multiple profiles of pin fins.
Figure 9B:
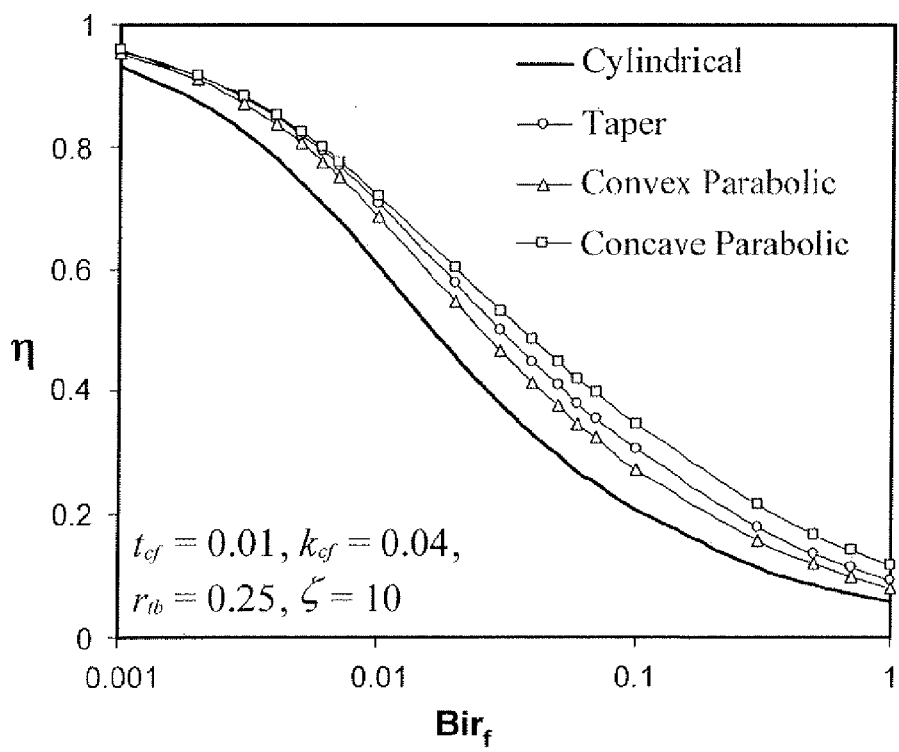
FIG. 9B is a graph illustrating efficiencies of multiple profiles of pin fins for a pin fin with a coating.
Figure 9C:
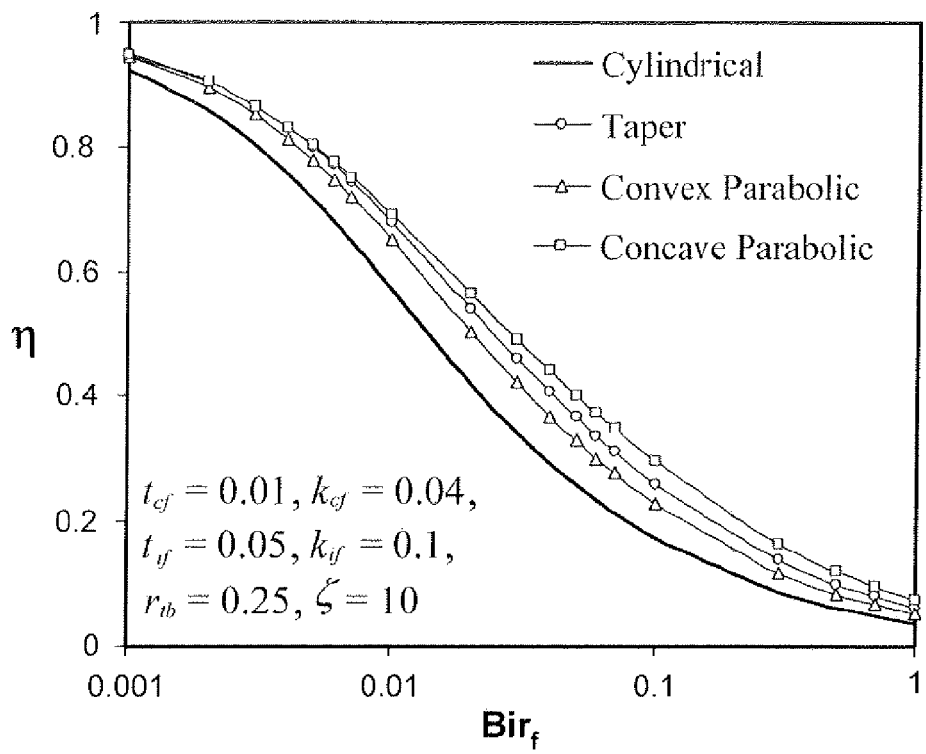
FIG. 9C is a graph illustrating efficiencies of multiple profiles of pin fins for a pin fin with a coating and with a thermal interface material.
Figure 10A:
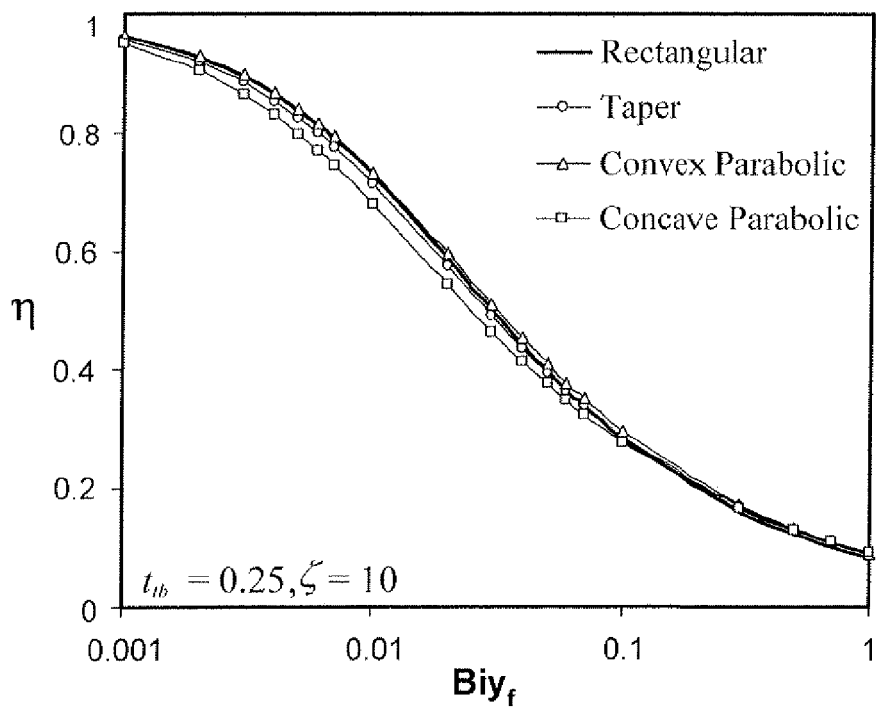
FIG. 10A is a graph illustrating efficiencies of multiple profiles of longitudinal fins.
Figure 10B:
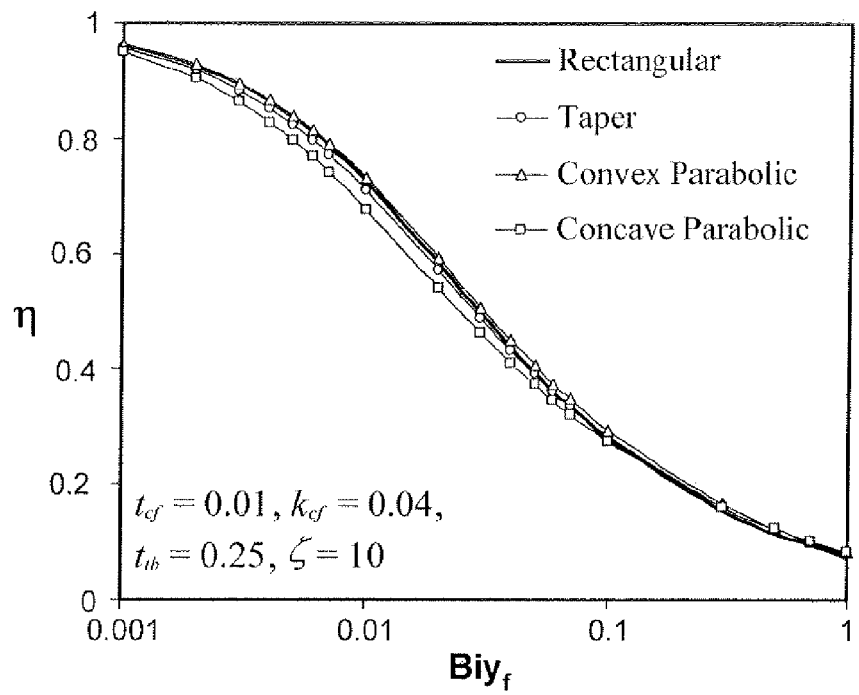
FIG. 10B is a graph illustrating efficiencies of multiple profiles of longitudinal fins for a longitudinal fin with a coating.
Figure 10C:
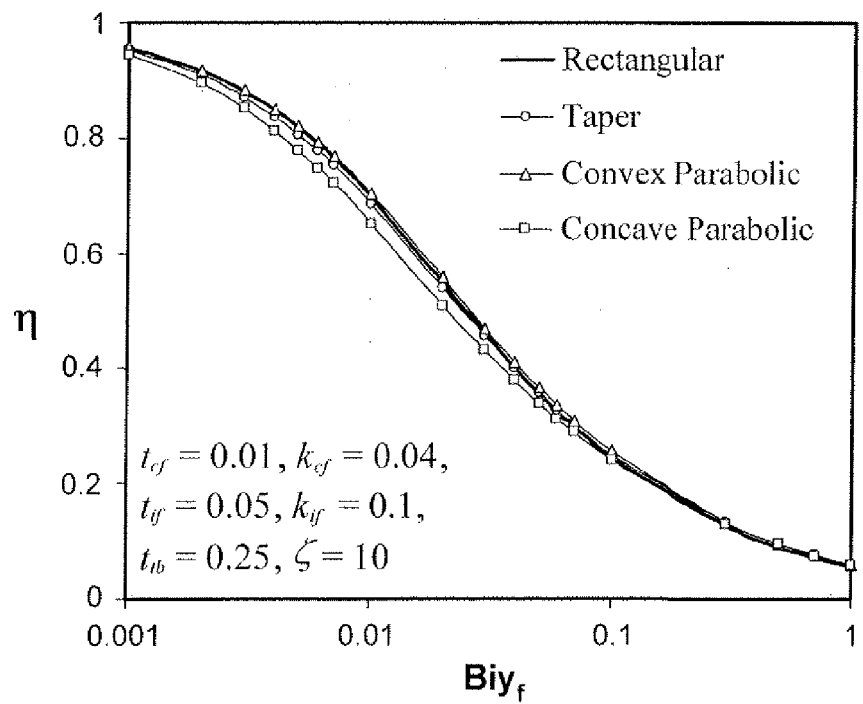
FIG. 10C is a graph illustrating efficiencies of multiple profiles of longitudinal fins for a longitudinal fin with a coating and with a thermal interface material.

The fin efficiencies with different configurations for different profile fins are presented in FIGS. 9A-9C for pin fins and in FIGS. 10A-10C for longitudinal fins. The results are in dimensionless form so they provide the solution to a class of problems. Thus, they can be used as design charts for the composite pin and longitudinal fins with the same values of dimensionless parameters.

It should be understood that the calculations may be performed by any suitable computer system, such as that diagrammatically shown in FIG. 1. Data is entered into the system 10 via any suitable type of user interface 18, and may be stored in memory 14, which may be any suitable type of computer readable and programmable memory. Calculations are performed by a processor 12, which may be any suitable type of computer processor, and may be displayed to the user on display 16, which may be any suitable type of computer display.

The processor 12 may be associated with, or incorporated into, any suitable type of computing device, for example, a personal computer or a programmable logic controller. The display 16, the processor 12, the memory 14 and any associated computer readable recording media are in communication with one another by any suitable type of data bus, as is well known in the art.

Examples of computer-readable recording media include a magnetic recording apparatus, an optical disk, a magneto-optical disk, and/or a semiconductor memory (for example, RAM, ROM, etc.). Examples of magnetic recording apparatus that may be used in addition to memory 14, or in place of memory 14, include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

It is to be understood that the present invention is not limited to the embodiments described above, but encompasses any and all embodiments within the scope of the following claims.

We claim:

1. A method of modeling thermal problems using a non-dimensional finite element method, comprising a computer executing the steps of:

(a) establishing a steady state heat conduction equation in three dimensions for an orthotropic material as $$k_x \frac{\partial^2 T}{\partial x^2} + k_y \frac{\partial^2 T}{\partial y^2} + k_z \frac{\partial^2 T}{\partial z^2} + G = 0,$$

wherein the orthotropic material has three surfaces having surface areas $S_1$, $S_2$ and $S_3$, respectively, wherein $T=T_b$ holds for $S_1$, $$k_x \frac{\partial T}{\partial x}\hat{l} + k_y \frac{\partial T}{\partial y}\hat{m} + k_z \frac{\partial T}{\partial z}\hat{n} + q^* = 0$$

holds for $S_2$, and $$k_x \frac{\partial T}{\partial x}\hat{l} + k_y \frac{\partial T}{\partial y}\hat{m} + k_z \frac{\partial T}{\partial z}\hat{n} + h(T - T_\infty) = 0$$

holds for $S_3$, where $k_x$, $k_y$, and $k_z$ are thermal conductivities in Cartesian x, y and z-directions, respectively, G is a rate of internal heat generation per unit volume, T is temperature, $T_b$ and $T_\infty$ are specified and ambient temperatures, respectively, $q^*$ is specified heat flux, h is a coefficient of convective heat transfer, and $\hat{l}$, $\hat{m}$ and $\hat{n}$ are surface normals, respectively corresponding to the Cartesian x, y and z-directions;

(b) establishing a scalar functional quantity $\Pi=U+\Omega_G+\Omega_q+\Omega_h$, wherein U represents internal energy, $\Omega_G$ represents internal heat generation, $\Omega_h$ represents heat convection, and $\Omega_q$ represents heat conduction, and:

$$U = \frac{1}{2}\int\int\int_V \left[k_x\left(\frac{\partial T}{\partial x}\right)^2 + k_y\left(\frac{\partial T}{\partial y}\right)^2 + k_z\left(\frac{\partial T}{\partial z}\right)^2\right]dV,$$

$$\Omega_G = -\int\int\int_V GTdV,$$

-continued $$\Omega_q = -\iint_{S2} q^* T dS, \text{ and}$$

$$\Omega_h = \frac{1}{2}\iint_{S3} h(T - T_\infty)^2 dS,$$

wherein V represents volume;

(c) establishing a set of non-dimensional parameters $$\theta = \frac{T}{T_\infty}, \bar{x} = \frac{x}{L_x}, \bar{y} = \frac{y}{L_y}, \text{ and } \bar{z} = \frac{z}{L_z},$$

where $\theta$ is non-dimensional temperature, $\bar{x}$, $\bar{y}$ and $\bar{z}$ are non-dimensional spatial variables, corresponding to a domain to be discretized and $L_x$, $L_y$ and $L_z$ are maximum dimensions of a domain to be discretized along the x, y and z-directions, respectively;

(d) expressing the scalar functional quantity for no internal heat generation in matrix form as:

$$\frac{\Pi}{hT_\infty^2} = \frac{1}{2}\iiint_V \{\bar{g}\}^T [\bar{L}]\{\bar{g}\} d\bar{V} -$$

$$\iint_{\bar{S}2} \{\theta\}^T [\bar{N}]^T \bar{q}^* d\bar{S} + \frac{1}{2}\iint_{\bar{S}3} (\{\theta\}^T [\bar{N}]^T - 1)^2 d\bar{S},$$

where $[\bar{N}]$ is a shape function matrix, $\{\bar{g}\}$ is a non-dimensional temperature gradient, $\{\theta\}$ is a non-dimensional temperature vector, $[\bar{D}]$ is a non-dimensional material property matrix, and $[\bar{L}]$ is a geometric dimensions ratio matrix, wherein $$\{\bar{g}\} = \left[\begin{array}{ccc}\frac{\partial \theta}{\partial \bar{x}} & \frac{\partial \theta}{\partial \bar{y}} & \frac{\partial \theta}{\partial \bar{z}}\end{array}\right]^T \text{ and}$$

$$\{\bar{g}\} = [\bar{B}]\{\theta\}, \text{ where } [\bar{B}] = \left[\begin{array}{ccc}\frac{\partial [\bar{N}]}{\partial \bar{x}} & \frac{\partial [\bar{N}]}{\partial \bar{y}} & \frac{\partial [\bar{N}]}{\partial \bar{z}}\end{array}\right]^T, \text{ and}$$

$$[\bar{D}] = \begin{bmatrix} \frac{1}{Bi_x} & 0 & 0 \\ 0 & \frac{1}{Bi_y} & 0 \\ 0 & 0 & \frac{1}{Bi_z} \end{bmatrix}, [\bar{L}] = \begin{bmatrix} 1 & 0 & 0 \\ 0 & \frac{L_x}{L_y} & 0 \\ 0 & 0 & \frac{L_x}{L_z} \end{bmatrix},$$

where $Bi_x$, $Bi_y$ and $Bi_z$ are Biot numbers given by $$Bi_x = \frac{hL_x}{k_x}, Bi_y = \frac{hL_y}{k_y} \text{ and } Bi_z = \frac{hL_z}{k_z}$$

and non-dimensional specified heat flux $\bar{q}^*$ is given by $$\bar{q}^* = \frac{q^*}{hT_\infty};$$

(e) minimizing a dimensionless scalar functional quantity given as $\bar{\Pi} = \Pi/hT_\infty^2 L_y L_z$ with respect to $\{\theta\}$ to yield:

$$\left[\iiint_{\bar{V}} [\bar{B}]^T [\bar{L}][\bar{D}][\bar{B}] d\bar{V} + \iint_{\bar{S}3} [[\bar{N}]^T [\bar{N}]] d\bar{S}\right]\{\theta\} =$$

$$\iint_{\bar{S}2} [\bar{N}]^T \bar{q}^* d\bar{S} + \iint_{\bar{S}3} [\bar{N}]^T d\bar{S};$$

(f) calculating an element stiffness matrix as $[\bar{k}] = [\bar{k}_q] + [\bar{k}_h]$, wherein $$[\bar{k}_q] = \iiint_{\bar{V}} [\bar{B}]^T [\bar{L}][\bar{D}][\bar{B}] d\bar{V} \text{ and } [\bar{k}_h] = \iint_{\bar{S}3} [[\bar{N}]^T [\bar{N}]] d\bar{S};$$

and (g) calculating an element load vector as $\{\bar{f}\} = \{\bar{f}_q\} + \{\bar{f}_h\}$, wherein:

$$[\bar{f}_q] = \iint_{\bar{S}2} [\bar{N}]^T \bar{q}^* d\bar{S} \text{ and } [\bar{f}_h] = \iint_{\bar{S}3} [\bar{N}] d\bar{S}.$$

2. The method as recited in claim 1, further comprising the steps of:
calculating the element stiffness matrix and the element load vector through insertion of the corresponding values of $[\bar{B}]$, $[\bar{L}]$, $[\bar{D}]$, and $[\bar{N}]$; and
integrating over the non-dimensional element volume and surface areas.

3. A system for modeling thermal problems using a non-dimensional finite element method, comprising:
a processor;
computer readable memory coupled to the processor;
a user interface coupled to the processor;
a display coupled to the processor;
software stored in the memory and executable by the processor, the software having:
means for establishing a steady state heat conduction equation in three dimensions for an orthotropic material as $$k_x \frac{\partial^2 T}{\partial x^2} + k_y \frac{\partial^2 T}{\partial y^2} + k_z \frac{\partial^2 T}{\partial z^2} + G = 0,$$

wherein the orthotropic material has three surfaces having surface areas $S_1$, $S_2$ and $S_3$, wherein $T=T_b$ for $S_1$, $$k_x \frac{\partial T}{\partial x}\hat{l} + k_y \frac{\partial T}{\partial y}\hat{m} + k_z \frac{\partial T}{\partial z}\hat{n} + q^* = 0$$

for $S_2$, and $$k_x \frac{\partial T}{\partial x}\hat{l} + k_y \frac{\partial T}{\partial y}\hat{m} + k_z \frac{\partial T}{\partial z}\hat{n} + h(T - T_\infty) = 0$$

for $S_3$, where $k_x$, $k_y$, and $k_z$ are thermal conductivities in Cartesian x, y and z-directions, respectively, G is a rate of internal heat generation per unit volume, T is temperature, $T_b$ and $T_\infty$ are specified and ambient temperatures, respectively, q* is specified heat flux, h is a coefficient of convective heat transfer, and $\hat{l}$, $\hat{m}$ and $\hat{n}$ are surface normals, respectively corresponding to the Cartesian x, y and z-directions;

means for establishing a scalar functional quantity $\Pi = U + \Omega_G + \Omega_q + \Omega_h$, wherein U represents internal energy, $\Omega_G$ represents internal heat generation, $\Omega_h$ represents heat convection, and $\Omega_q$ represents heat conduction, and $$U = \frac{1}{2} \iiint_V \left[ k_x \left(\frac{\partial T}{\partial x}\right)^2 + k_y \left(\frac{\partial T}{\partial y}\right)^2 + k_z \left(\frac{\partial T}{\partial z}\right)^2 \right] dV,$$

$$\Omega_G = -\iiint_V GT dV, \quad \Omega_q = -\iint_{S2} q^* T dS, \text{ and}$$

$$\Omega_h = \frac{1}{2} \iint_{S3} h(T - T_\infty)^2 dS,$$

wherein V represents volume;

means for establishing a set of non-dimensional parameters $$\theta = \frac{T}{T_\infty}, \bar{x} = \frac{x}{L_x}, \bar{y} = \frac{y}{L_y}, \text{ and } \bar{z} = \frac{z}{L_z},$$

where $\theta$ is non-dimensional temperature, $\bar{x}$, $\bar{y}$ and $\bar{z}$ are non-dimensional spatial variables, corresponding to a domain to be discretized, and $L_x$, $L_y$ and $L_z$ are maximum dimensions of a domain to be discretized along the x, y and z-directions, respectively;

means for expressing the scalar functional quantity for no internal heat generation in matrix form as $$\frac{\Pi}{hT_\infty^2} = \frac{1}{2} \iiint_V \{\bar{g}\}^T [\bar{L}]\{\bar{g}\} dV -$$

$$\iint_{S2} \{\theta\}^T [\bar{N}]^T \bar{q}^* d\bar{S} + \frac{1}{2} \iint_{S3} \left(\{\theta\}^T [\bar{N}]^T - 1\right)^2 d\bar{S},$$

where $[\bar{N}]$ is a shape function matrix, $\{\bar{g}\}$ is a non-dimensional temperature gradient, $\{\theta\}$ is a non-dimensional temperature vector, $[\bar{D}]$ is a non-dimensional material property matrix, and $[\bar{L}]$ is a geometric dimensions ratio matrix, wherein $$\{\bar{g}\} = \left[ \frac{\partial \theta}{\partial \bar{x}} \quad \frac{\partial \theta}{\partial \bar{y}} \quad \frac{\partial \theta}{\partial \bar{z}} \right]^T \text{ and } \{\bar{g}\} = [\bar{B}]\{\theta\},$$

where $$[\bar{B}] = \left[ \frac{\partial [\bar{N}]}{\partial \bar{x}} \quad \frac{\partial [\bar{N}]}{\partial \bar{y}} \quad \frac{\partial [\bar{N}]}{\partial \bar{z}} \right]^T,$$

$$[\bar{D}] = \begin{bmatrix} \frac{1}{Bi_x} & 0 & 0 \\ 0 & \frac{1}{Bi_y} & 0 \\ 0 & 0 & \frac{1}{Bi_z} \end{bmatrix}, [\bar{L}] = \begin{bmatrix} 1 & 0 & 0 \\ 0 & \frac{L_x}{L_y} & 0 \\ 0 & 0 & \frac{L_x}{L_z} \end{bmatrix},$$

where $Bi_x$, $Bi_y$ and $Bi_z$ are Biot numbers given by $$Bi_x = \frac{hL_x}{k_x}, Bi_y = \frac{hL_y}{k_y} \text{ and } Bi_z = \frac{hL_z}{k_z}$$

and non-dimensional specified heat flux $\bar{q}^*$ is given by $$\bar{q}^* = \frac{q^*}{hT_\infty};$$

means for minimizing a dimensionless scalar functional quantity given as $\bar{\Pi} = \Pi/hT_\infty^2 L_y L_z$ with respect to $\{\theta\}$ to yield $$\left[ \iiint_V [\bar{B}]^T [\bar{L}][\bar{D}][\bar{B}] d\bar{V} + \iint_{S3} [[\bar{N}]^T [\bar{N}]] d\bar{S} \right] \{\theta\} =$$

$$\iint_{S2} [\bar{N}]^T \bar{q}^* d\bar{S} + \iint_{S3} [\bar{N}]^T d\bar{S};$$

means for calculating an element stiffness matrix as $[\bar{k}] = [\bar{k}_q] + [\bar{k}_h]$, wherein $$[\bar{k}_q] = \iiint_V [\bar{B}]^T [\bar{L}][\bar{D}][\bar{B}] d\bar{V} \text{ and } [\bar{k}_h] = \iint_{S3} [[\bar{N}]^T [\bar{N}]] d\bar{S};$$

and means for calculating an element load vector as $\{\bar{f}\} = \{\bar{f}_q\} + \{\bar{f}_h\}$, wherein $$[\bar{f}_q] = \iint_{S2} [\bar{N}]^T \bar{q}^* d\bar{S} \text{ and } [\bar{f}_h] = \iint_{S3} [\bar{N}]^T d\bar{S}.$$

4. The system for modeling thermal problems using a non-dimensional finite element method as recited in claim 3, wherein said means for calculating the element stiffness matrix and the element load vector comprises:

means for inserting the corresponding values of $[\bar{B}]$, $[\bar{L}]$, $[\bar{D}]$, and $[\bar{N}]$ into the element stiffness matrix and the element load vector; and means for integrating over the non-dimensional element volume and surface areas.

5. A computer software product that includes a non-transitory storage medium readable by a processor, the non-transitory storage medium having stored thereon a set of instructions for modeling thermal problems using a non-dimensional finite element method, the instructions comprising:

(a) a first sequence of instructions which, when executed by the processor, causes the processor to establish a set of non-dimensional parameters $$\theta = \frac{T}{T_\infty}, \bar{x} = \frac{x}{L_x}, \bar{y} = \frac{y}{L_y}, \text{ and } \bar{z} = \frac{z}{L_z},$$

where $\theta$ is non-dimensional temperature, $\bar{x}, \bar{y}$ and $\bar{z}$ are non-dimensional spatial variables, corresponding to a domain to be discretized, and $L_x$, $L_y$ and $L_z$ are maximum dimensions of a domain to be discretized along the x, y and z-directions, respectively;

(b) a second sequence of instructions which, when executed by the processor, causes the processor to calculate an element stiffness matrix as $[\bar{k}]=[\bar{k}_q]+[\bar{k}_h]$, wherein $$[\bar{k}_q] = \int\int\int_V [\bar{B}]^T [\bar{L}][\bar{D}][\bar{B}] d\bar{V} \text{ and } [\bar{k}_h] = \int\int_{S3} [[\bar{N}]^T [\bar{N}]] d\bar{S},$$

wherein a steady state heat conduction equation in three dimensions for an orthotropic material is given by $$k_x \frac{\partial^2 T}{\partial x^2} + k_y \frac{\partial^2 T}{\partial y^2} + k_z \frac{\partial^2 T}{\partial z^2} + G = 0,$$

such that the orthotropic material has three surfaces having surface areas $S_1$, $S_2$ and $S_3$, respectively, wherein $T=T_b$, holds for $S_1$, $$k_x \frac{\partial T}{\partial x} \hat{l} + k_y \frac{\partial T}{\partial y} \hat{m} + k_z \frac{\partial T}{\partial z} \hat{n} + q^* = 0$$

holds for $S_2$, and $$k_x \frac{\partial T}{\partial x} \hat{l} + k_y \frac{\partial T}{\partial y} \hat{m} + k_z \frac{\partial T}{\partial z} \hat{n} + h(T - T_\infty) = 0$$

holds for $S_3$, where $k_x$, $k_y$, and $k_z$ are thermal conductivities in Cartesian x, y and z-directions, respectively, G is a rate of internal heat generation per unit volume, T is temperature, $T_b$ and $T_\infty$ are specified and ambient temperatures, respectively, $q^*$ is specified heat flux, h is a coefficient of convective heat transfer, and $\hat{l}$, $\hat{m}$ and $\hat{n}$ are surface normals, respectively corresponding to the Cartesian x, y and z-directions, and wherein a scalar functional quantity is given as $\Pi=U+\Omega_G+\Omega_q+\Omega_h$, wherein U represents internal energy, $\Omega_G$ represents internal heat generation, $\Omega_h$ represents heat convection, and $\Omega_q$ represents heat conduction, and:

$$U = \frac{1}{2} \int\int\int_V \left[ k_x \left(\frac{\partial T}{\partial x}\right)^2 + k_y \left(\frac{\partial T}{\partial y}\right)^2 + k_z \left(\frac{\partial T}{\partial z}\right)^2 \right] dV,$$

$$\Omega_G = -\int\int\int_V GT dV,$$

$$\Omega_q = -\int\int_{S2} q^* T dS, \text{ and}$$

$$\Omega_h = \frac{1}{2} \int\int_{S3} h(T - T_\infty)^2 dS,$$

wherein V represents volume, and wherein the scalar functional quantity for no internal heat generation is represented in matrix form as:

$$\frac{\Pi}{hT_\infty^2} = \frac{1}{2} \int\int\int_{\bar{V}} \{\bar{g}\}^T [\bar{L}]\{\bar{g}\} d\bar{V} -$$

$$\int\int_{S2} \{\theta\}^T [\bar{N}]^T \bar{q}^* d\bar{S} + \frac{1}{2} \int\int_{S3} (\{\theta\}^T [\bar{N}]^T - 1)^2 d\bar{S},$$

where $[\bar{N}]$ is a shape function matrix, $\{\bar{g}\}$ is a non-dimensional temperature gradient, $\{\theta\}$ is a non-dimensional temperature vector, $[\bar{D}]$ is a non-dimensional material property matrix, and $[\bar{L}]$ is a geometric dimensions ratio matrix, wherein $$\{\bar{g}\} = \left[\frac{\partial \theta}{\partial \bar{x}} \frac{\partial \theta}{\partial \bar{y}} \frac{\partial \theta}{\partial \bar{z}}\right]^T \text{ and } \{\bar{g}\} = [\bar{B}]\{\theta\}, \text{ where}$$

$$[\bar{B}] = \left[\frac{\partial [\bar{N}]}{\partial \bar{x}} \frac{\partial [\bar{N}]}{\partial \bar{y}} \frac{\partial [\bar{N}]}{\partial \bar{z}}\right]^T, \text{ and}$$

$$[\bar{D}] = \begin{bmatrix} 1/Bi_x & 0 & 0 \\ 0 & 1/Bi_y & 0 \\ 0 & 0 & 1/Bi_z \end{bmatrix}, [\bar{L}] = \begin{bmatrix} 1 & 0 & 0 \\ 0 & L_x/L_y & 0 \\ 0 & 0 & L_x/L_z \end{bmatrix},$$

where $Bi_x$, $Bi_y$ and $Bi_z$ are Biot numbers given by $$Bi_x = \frac{hL_x}{k_x}, Bi_y = \frac{hL_y}{k_y} \text{ and } Bi_z = \frac{hL_z}{k_z}$$

and non-dimensional specified heat flux $\bar{q}^*$ is given by $$\bar{q}^* = \frac{q^*}{hT_\infty},$$

such that a dimensionless scalar functional quantity given as $\bar{\Pi}=\Pi/hT_\infty^2 L_y L_z$ may be minimized with respect to $\{\theta\}$ to yield:

$$\left[\int\int\int_V [\bar{B}]^T [\bar{L}][\bar{D}][\bar{B}]d\bar{V} + \int\int_{S3}[[\bar{N}]^T[\bar{N}]]d\bar{S}\right]\{\theta\} =$$
$$\int\int_{S2}[\bar{N}]^T \bar{q}^* d\bar{S} + \int\int_{S3}[\bar{N}]^T d\bar{S};$$

and (c) a third sequence of instructions which, when executed by the processor, causes the processor to calculate an element load vector as $\{\bar{f}\}=\{\bar{f}_q\}+\{\bar{f}_h\}$, wherein $$[\bar{f}_q] = \int\int_{S2}[\bar{N}]^T \bar{q}^* d\bar{S} \text{ and } [\bar{f}_h] = \int\int_{S3}[\bar{N}]^T d\bar{S}.$$

* * * * *

UNITED STATES PATENT AND TRADEMARK OFFICE
CERTIFICATE OF CORRECTION

| | |
|---|---|
| PATENT NO. | : 8,600,710 B2 |
| APPLICATION NO. | : 13/253778 |
| DATED | : December 3, 2013 |
| INVENTOR(S) | : Abul Fazal Muhammad Arif et al. |

Page 1 of 1

It is certified that error appears in the above-identified patent and that said Letters Patent is hereby corrected as shown below:

Title Page (75) First Inventor's given name is misspelled and should be: Abul Fazal Muhammad Arif Signed and Sealed this
Sixth Day of May, 2014

Michelle K. Lee
*Deputy Director of the United States Patent and Trademark Office*